(12) United States Patent
Moslehi et al.

(10) Patent No.: US 8,946,547 B2
(45) Date of Patent: Feb. 3, 2015

(54) BACKPLANE REINFORCEMENT AND INTERCONNECTS FOR SOLAR CELLS

(75) Inventors: Mehrdad M. Moslehi, Los Altos, CA (US); David Xuan-Qi Wang, Fremont, CA (US); Karl-Josef Kramer, San Jose, CA (US); Sean M. Seutter, San Jose, CA (US); Sam Tone Tor, Pleasanton, CA (US); Anthony Calcaterra, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 493 days.

(21) Appl. No.: 13/204,626

(22) Filed: Aug. 5, 2011

(65) Prior Publication Data

US 2012/0103408 A1 May 3, 2012

Related U.S. Application Data

(60) Provisional application No. 61/370,956, filed on Aug. 5, 2010.

(51) Int. Cl.
*H01L 31/00* (2006.01)
*H01L 31/05* (2014.01)
*H01L 31/0224* (2006.01)

(52) U.S. Cl.
CPC .... *H01L 31/022441* (2013.01); *H01L 31/0516* (2013.01); *Y02E 10/50* (2013.01)
USPC .............................. 136/259; 136/251; 136/261

(58) Field of Classification Search
None
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,394,529 A | 7/1983 | Gounder |
| 4,409,423 A | 10/1983 | Holt |
| 4,427,839 A | 1/1984 | Hall |
| 4,430,519 A | 2/1984 | Young |

(Continued)

FOREIGN PATENT DOCUMENTS

| | | |
|---|---|---|
| JP | 06-260670 A | 9/1994 |
| JP | 07-302923 | 11/1995 |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Miriam Berdichevsky

(57) ABSTRACT

Fabrication methods and structures relating to backplanes for back contact solar cells that provide for solar cell substrate reinforcement and electrical interconnects are described. The method comprises depositing an interdigitated pattern of base electrodes and emitter electrodes on a backside surface of a semiconductor substrate, forming electrically conductive emitter plugs and base plugs on the interdigitated pattern, and attaching a backplane having a second interdigitated pattern of base electrodes and emitter electrodes at the conductive emitter and base plugs to form electrical interconnects.

32 Claims, 21 Drawing Sheets

(56) References Cited

U.S. PATENT DOCUMENTS

| | | |
|---|---|---|
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |
| 4,922,277 A | 5/1990 | Carlson |
| 5,024,953 A | 6/1991 | Uematsu et al. |
| 5,073,230 A | 12/1991 | Maracas et al. |
| 5,112,453 A | 5/1992 | Behr et al. |
| 5,208,068 A | 5/1993 | Davis |
| 5,248,621 A | 9/1993 | Sano |
| 5,316,593 A | 5/1994 | Olson et al. |
| 5,330,583 A | 7/1994 | Asai |
| 5,348,618 A | 9/1994 | Canham et al. |
| 5,397,400 A | 3/1995 | Matsuno et al. |
| 5,458,755 A | 10/1995 | Fujiyama et al. |
| 5,459,099 A | 10/1995 | Hsu |
| 5,494,832 A | 2/1996 | Lehmann et al. |
| 5,538,564 A | 7/1996 | Kaschmitter |
| 5,616,185 A | 4/1997 | Kukulka |
| 5,645,684 A | 7/1997 | Keller |
| 5,660,680 A | 8/1997 | Keller |
| 5,681,392 A | 10/1997 | Swain |
| 5,704,992 A | 1/1998 | Willeke et al. |
| 5,882,988 A | 3/1999 | Haberern et al. |
| 5,899,360 A | 5/1999 | Mack et al. |
| 5,928,438 A | 7/1999 | Salami |
| 5,994,640 A | 11/1999 | Bansemir et al. |
| 6,054,363 A | 4/2000 | Sakaguchi |
| 6,058,945 A | 5/2000 | Fujiyama et al. |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,143,629 A | 11/2000 | Sato |
| 6,204,443 B1 | 3/2001 | Kiso et al. |
| 6,225,193 B1 | 5/2001 | Simpson et al. |
| 6,274,402 B1 | 8/2001 | Verlinden |
| 6,294,725 B1 | 9/2001 | Hirschberg et al. |
| 6,331,208 B1 | 12/2001 | Nishida et al. |
| 6,399,143 B1 | 6/2002 | Sun |
| 6,416,647 B1 | 7/2002 | Dordi et al. |
| 6,428,620 B1 | 8/2002 | Yamagata et al. |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,524,880 B2 | 2/2003 | Moon et al. |
| 6,534,336 B1 | 3/2003 | Iwane |
| 6,551,908 B2 | 4/2003 | Ukiyo et al. |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,694,613 B2 | 2/2004 | Nakamura |
| 6,756,289 B1 | 6/2004 | Nakagawa et al. |
| 6,818,104 B2 | 11/2004 | Iwasake et al. |
| 6,881,644 B2 | 4/2005 | Malik et al. |
| 6,908,846 B2 | 6/2005 | McMillin |
| 6,946,052 B2 | 9/2005 | Yanagita et al. |
| 6,964,732 B2 | 11/2005 | Solanki |
| 7,014,748 B2 | 3/2006 | Matsumura et al. |
| 7,022,585 B2 | 4/2006 | Solanki et al. |
| 7,026,237 B2 | 4/2006 | Lamb |
| 7,179,987 B2 | 2/2007 | Fath |
| 7,309,658 B2 | 12/2007 | Lazovsky et al. |
| 7,368,756 B2 | 5/2008 | Bruhns et al. |
| 7,388,147 B2 | 6/2008 | Mulligan |
| 7,402,523 B2 | 7/2008 | Nishimura |
| 7,700,400 B2 | 4/2010 | Onishi |
| 7,736,994 B2 | 6/2010 | Reynaud |
| 7,737,357 B2 | 6/2010 | Cousins |
| 7,888,168 B2 | 2/2011 | Weidman |
| 8,035,028 B2 | 10/2011 | Moslehi |
| 8,084,684 B2 | 12/2011 | Moslehi |
| 8,168,465 B2 | 5/2012 | Wang |
| 8,183,081 B2 | 5/2012 | Weidman |
| 8,409,976 B2 | 4/2013 | Hieslmair |
| 2002/0079290 A1 | 6/2002 | Holdermann |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0103857 A1 | 6/2003 | Heindel |
| 2003/0124761 A1 | 7/2003 | Baert |
| 2004/0028875 A1 | 2/2004 | Van Rijn |
| 2004/0173790 A1 | 9/2004 | Yeo |
| 2004/0175893 A1 | 9/2004 | Vatus et al. |
| 2004/0192044 A1 | 9/2004 | Degertekin et al. |
| 2004/0235406 A1 | 11/2004 | Duescher |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0162766 A1 | 7/2006 | Gee |
| 2006/0177988 A1 | 8/2006 | Shea et al. |
| 2006/0196536 A1 | 9/2006 | Fujioka |
| 2006/0231031 A1 | 10/2006 | Dings et al. |
| 2006/0266916 A1 | 11/2006 | Miller et al. |
| 2006/0283495 A1 | 12/2006 | Gibson |
| 2006/0286775 A1 | 12/2006 | Singh et al. |
| 2007/0026547 A1 | 2/2007 | Kumar |
| 2007/0074755 A1 | 4/2007 | Eberspacher |
| 2007/0077770 A1 | 4/2007 | Wang et al. |
| 2007/0082499 A1 | 4/2007 | Jung et al. |
| 2008/0006319 A1 | 1/2008 | Bettge |
| 2008/0047601 A1 | 2/2008 | Nag et al. |
| 2008/0072958 A1 | 3/2008 | Dutta |
| 2008/0128641 A1 | 6/2008 | Henley et al. |
| 2008/0157283 A1 | 7/2008 | Moslehi |
| 2008/0210294 A1 | 9/2008 | Moslehi |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0114276 A1* | 5/2009 | Shan et al. ............... 136/256 |
| 2009/0126788 A1 | 5/2009 | Hishida |
| 2009/0139570 A1 | 6/2009 | Kinoshita |
| 2009/0301549 A1 | 12/2009 | Moslehi |
| 2010/0022074 A1 | 1/2010 | Wang et al. |
| 2010/0032014 A1 | 2/2010 | Bettinelli |
| 2010/0084009 A1 | 4/2010 | Carlson |
| 2010/0108130 A1 | 5/2010 | Ravi |
| 2010/0116316 A1 | 5/2010 | Moslehi et al. |
| 2010/0133546 A1 | 6/2010 | Jain |
| 2010/0144080 A1 | 6/2010 | Ong |
| 2010/0148318 A1 | 6/2010 | Wang et al. |
| 2010/0148319 A1 | 6/2010 | Wang et al. |
| 2010/0154998 A1 | 6/2010 | Ong |
| 2010/0175752 A1 | 7/2010 | Wang et al. |
| 2010/0203711 A1 | 8/2010 | Wang et al. |
| 2010/0243028 A1 | 9/2010 | Sainoo |
| 2010/0243041 A1 | 9/2010 | Carlson |
| 2010/0267186 A1 | 10/2010 | Wang et al. |
| 2010/0267245 A1 | 10/2010 | Kamian et al. |
| 2010/0279494 A1 | 11/2010 | Wang et al. |
| 2010/0294333 A1 | 11/2010 | Wang et al. |

(56) References Cited

U.S. PATENT DOCUMENTS

| | | |
|---|---|---|
| 2010/0294356 A1 | 11/2010 | Parikh et al. |
| 2010/0300518 A1 | 12/2010 | Moslehi et al. |
| 2010/0304521 A1 | 12/2010 | Seutter et al. |
| 2010/0304522 A1 | 12/2010 | Rana et al. |
| 2010/0308660 A1 | 12/2010 | Willis |
| 2010/0319768 A1 | 12/2010 | Mitchell |
| 2011/0014742 A1 | 1/2011 | Parikh et al. |
| 2011/0030610 A1 | 2/2011 | Kamian et al. |
| 2011/0041902 A1 | 2/2011 | Krokoszinski |
| 2011/0041908 A1 | 2/2011 | Harder |
| 2011/0053312 A1 | 3/2011 | Teppe |
| 2011/0070681 A1 | 3/2011 | Nakayashiki |
| 2011/0126878 A1 | 6/2011 | Hacke |
| 2011/0155222 A1 | 6/2011 | Ehbing |
| 2011/0298100 A1 | 12/2011 | Nakamura |
| 2012/0048335 A1 | 3/2012 | Nakamura |
| 2012/0305063 A1 | 12/2012 | Moslehi |
| 2013/0233378 A1 | 10/2013 | Moslehi |

FOREIGN PATENT DOCUMENTS

| | | |
|---|---|---|
| JP | 2002-299661 A | 10/2002 |
| JP | 2005-268719 | 9/2005 |
| JP | 2006-120945 | 5/2006 |
| JP | 2008-153429 | 7/2008 |
| KR | 10-2009-0091456 | 8/2009 |
| WO | PCT/EP1999/008573 | 5/2000 |
| WO | WO 2008-136872 | 11/2008 |
| WO | WO 2009-052511 | 4/2009 |
| WO | WO 2009-107920 | 9/2009 |
| WO | WO 2009-129030 | 10/2009 |
| WO | WO 2009-140117 | 11/2009 |
| WO | WO 2009-149850 | 12/2009 |
| WO | WO 2009-151809 | 12/2009 |
| WO | WO 2010-025269 | 3/2010 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.
C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.
C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.
C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.
F.Duerinckx, et al, Reorganized Porous Silicon Bragg Reflectors for Thin-Film Silicon Solar Cells, IEEE Electron Device Letters, Oct. 2006, vol. 27, No. 10.
Francois J. Henley, Layer-Transfer Quality Cleave Principles, SiGen, Jul. 8, 2005, pp. 1-6, The Silicon Genesis Corporation, San Jose, California.
J.H.Werner et al, From Polycrystalline to Single Crystalline Silicon on Glass, Thin Solid Films, 2001, pp. 95-100, vol. 383, Issue 1-2, Elsevier Science B.V., Germany.
J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.
K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.
K.L. Chopra et al., Thin-Film Solar Cells: An Overview, Progress in Photovoltaics: Research and Applications, 2004, pp. 69-92, vol. 12, John Wiley & Sons, Ltd.
MacDonald et al., "Design and Fabrication of Highly Topographic Nano-imprint Template for Dual Damascene Full 3-D Imprinting," Dept. of Chemical Eng., University of Texas at Austin, Oct. 24, 2005.
Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.
Martin A. Green, Silicon Photovoltaic Modules: A Brief History of the First 50 Years, Progress in Photovoltaics: Research and Applications, 2005, pp. 447-455, vol. 13, John Wiley & Sons, Ltd.
Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.
P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.
P.R. Hageman et al., Large Area, Thin Film Epitaxial Lift Off III/V Solar Cells, 25th PVSC, May 13-17, 1996, Washington D.C., IEEE.
Photovoltaic Technology Research Advisory Council, A Vision for Photovoltaic Technology, 2005, pp. 1-41, European Commision Publications Office.
R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.
Richard Auer et al, Simplified Transfer Process for High-Current Thin-Film Crystalline Si Solar Modules, 3rd World Conference on Photovoltaic Energy Conversion, May 11-18, 2003, Osaka, Japan.
Richard M. Swanson, A Vision for Crystalline Silicon Photovoltaics, Progress in Photovoltaics: Research and Applications, 2006, pp. 443-453, vol. 14, John Wiley & Sons, Ltd.
Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.
Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.
Rolf Brendel, Thin-Film Crystalline Silicone Mini-Modules Using Porous Si for Layer Transfer, Solar Energy, 2004, pp. 969-982, vol. 77, Elsevier Ltd., Germany.
S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.
Takao Yonehara, et al, Epitaxial Layer Transfer by Bond and Etch Back of Porous Si, Applied Physics Letter 64, Apr. 18, 1994, vol. 16, American Institute of Physics.
Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

Backside

Backside

Backside

Backside

BACKPLANE REINFORCEMENT AND INTERCONNECTS FOR SOLAR CELLS

CROSS-REFERENCE TO RELATED APPLICATIONS

This application claims priority to U.S. Provisional Patent Application Ser. No. 61/370,956 filed Aug. 5, 2010, which is hereby incorporated by reference in its entirety.

This application also claims priority to U.S. patent application Ser. Nos. 13/057,104, 13/057,115, and 13/057,123 which are hereby incorporated by reference in their entirety.

FIELD

The present disclosure relates in general to the fields of photovoltaics and microelectronics. More particularly, methods, architectures, and apparatus related to high-performance electrical interconnects and mechanical reinforcement for back contact photovoltaic solar cells.

BACKGROUND

Photovoltaic solar cells, including crystalline silicon solar cells, may be categorized as front-contact or back-contact cells based on the locations of the two polarities of the solar cell metal electrodes (emitter and base electrodes). Conventional front-contact cells have emitter electrode contacts on the cell frontside, also called the sunny side or light capturing side, and base electrode contacts on the cell backside (or base electrodes on the cell frontside and emitter electrodes on the cell backside in the case of front-contact/back-junction solar cells)—in either case, the emitter and base electrodes are positioned on opposite sides of the solar cell. Back-contact cells, however, have both polarities of the metal electrodes with contacts on the cell backside. Major advantages of back-contact solar cells include:

(1) No optical shading and optical reflection losses from the metal contacts on the cell sunny side, due to the absence of metal electrode grids on the front side, which leads to an increased short-circuit current density ($J_{sc}$) of the back-contact solar cell;

(2) The electrode width and thickness may be increased and optimized without optical shading concerns since both metal electrodes are placed on the cell backside, therefore the series resistance of the emitter and base metal grids are reduced and the overall current carrying capability of metallization and the resulting cell conversion efficiency is increased;

(3) Back-contact solar cells are more aesthetically appealing than the front-contact cell due to the absence of the front metal grids.

International Patent Publication Nos. WO2011/072161 and WO2011/072179, which are hereby incorporated by reference in their entirety for all purposes as if set forth fully herein, disclose back-contact mono-crystalline silicon solar cells utilizing thin silicon substrates. In WO2011/072179, the thin silicon substrate is a standard czochralski (CZ) wafer with a thickness reduced by mechanical surface grinding or chemical silicon etching (or another method such as cleaving thin silicon substrates from thicker wafers using proton implantation or stress induced cleavage). In WO2011/072161, the thin silicon substrate is an epitaxial-grown thin film silicon substrate (TFSS). Here, the epitaxial silicon layer may be initially grown on a porous silicon release layer on top of a reusable silicon template and then released/separated from the template at the porous silicon release layer after a partial or full completion of the cell fabrication process steps. Both the thin CZ wafer and TFSS may be substantially planar or consist of regular or irregular three-dimensional microstructures.

However, there are challenges associated with back-contact solar cells, which include:

(1) Due to the relatively thinner substrate thickness (in the range of about 1 μm to 100 μm, and less than 50 μm in some embodiments) the substrate must be mechanically supported and reinforced with a more rigid back plane/plate during processing in order to prevent cracking of the thin silicon and resulting manufacturing yield losses; and (2) The co-planar interconnections of the metal electrodes require higher electrode positioning accuracy than front-contact solar cells in order to prevent fatal shunting between the counter electrodes attaching to the base and emitter regions.

Designing cell architecture and manufacturing processes to prevent these and other problems associated with back contact solar cells remains a challenge as obtaining a high manufacturing yield of back contact solar cells requires robust fabrication processes and an effective cell design.

SUMMARY

Therefore, a need has arisen for fabrication methods and designs relating to a back contact solar cells. In accordance with the disclosed subject matter, methods, structures, and apparatus for making a mechanically supporting backplane structure with high-conductivity metal interconnects for extracting cell current which enable fabrication and final module packaging of back-contact solar cells are provided. These innovations substantially reduce or eliminate disadvantages and problems associated with previously developed back contact solar cells.

According to one aspect of the disclosed subject matter, fabrication methods and structures relating to backplanes for back contact solar cells that provide for solar cell substrate reinforcement and electrical interconnects are described. The method comprises depositing an interdigitated pattern of base electrodes and emitter electrodes on a backside surface of a semiconductor substrate, forming electrically conductive emitter plugs and base plugs on the interdigitated pattern, and attaching a backplane having a second interdigitated pattern of base electrodes and emitter electrodes at the conductive emitter and base plugs to form electrical interconnects. Technical advantages of the disclosed subject matter include reduced cost and increase efficiency of back contact solar cell fabrication.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description be within the scope of the claims.

BRIEF DESCRIPTION OF THE DRAWINGS

The features, nature, and advantages of the disclosed subject matter may become more apparent from the detailed description set forth below when taken in conjunction with the drawings in which like reference numerals indicate like features and wherein.

DETAILED DESCRIPTION

Figure 1A:
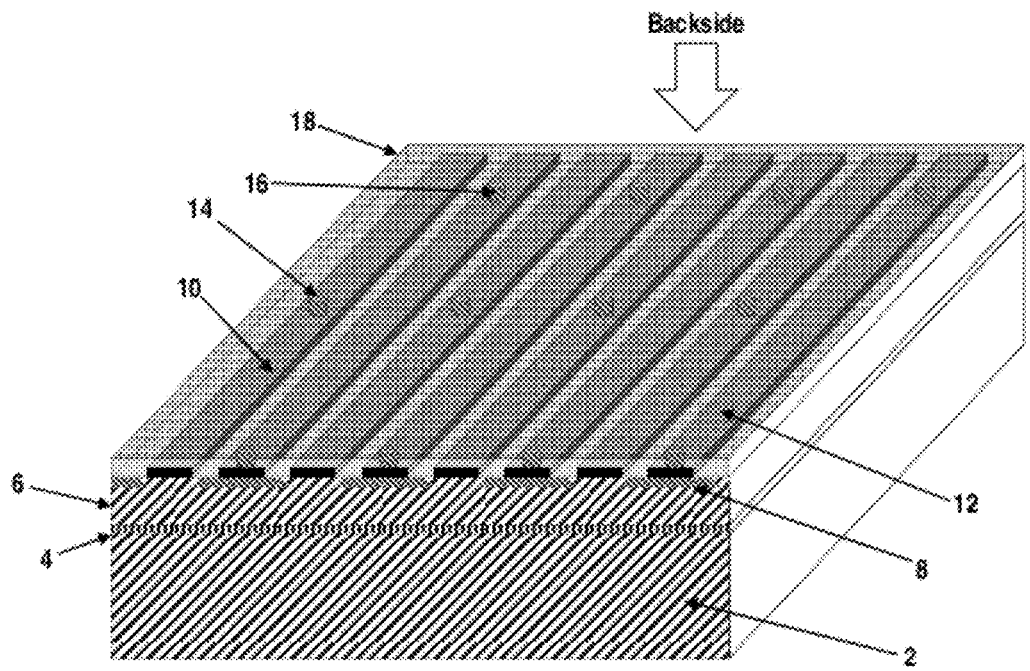
FIGS. 1A and B are schematic drawings of embodiments of partially fabricated TFSS-based back contact solar cells.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as silicon and other fabrication materials, one skilled in the art could apply the principles discussed herein to other materials, technical areas, and/or embodiments without undue experimentation.

It is to be especially noted that although this application references epitaxially-grown crystalline thin film silicon substrates (TFSS) for use in thin silicon solar cells as a representative example, the backplane reinforcement and electrical interconnecting methods, designs, apparatus, and processes disclosed are widely and equally applicable to any type of semiconductor substrate, such as compound semiconductors including GaAs, as well as thin czochralski (CZ) or Float Zone (FZ) wafers produced from crystalline semiconductor ingots.

Further, the term conductive "posts" is used in example embodiments where the terms conductive "plugs" or conductive "bumps" are also applicable and may be used interchangeably, as is any term that may describe a contact connection between the thin electrode layer on the solar cell and the thick electrode layer on the backplane.

The disclosed subject matter addresses some of the current hurdles to the implementation and fabrication of high efficiency backplane solar cells on thin solar substrates; particularly processing methods and designs providing continuous mechanical and structural support to thin substrates in order to eliminate substrate cracking and fractures and the formation of high-conductivity cell interconnects.

The designs and methods of the disclosed subject matter generally include a backplane with a preferably interdigitated-patterned of electrically conductive (i.e., metallic material such as aluminum, aluminum alloy, or copper) interconnect layer and an optional dielectric insulating layer. The backplane may then be bonded to a TFSS surface with electrically conductive and electrically insulating adhesive materials in an aligned bonding and lamination process. The patterned metallic interconnect layer on the backplane is typically much thicker than the metallic layer on the solar cell TFSS, and may be as thick as 0.1 mm to 1 mm (or larger) or smaller and also in the range of 25 to 250 microns depending on other solar cell considerations. Therefore, the current may be directly extracted from the thin solar cell and guided to the backplane through the conductive adhesive plugs/bumps/posts that connect the patterned thin metal layer on the solar cell and the patterned thick metal layer on the backplane. The backplane-bonded TFSS may then be released/separated from the reusable semiconductor (e.g., silicon for silicon solar cells) template. The released silicon side of the TFSS (the sunny side, frontside of the cell) is then chemically cleaned, optionally and preferably textured, and coated with a surface passivation and anti-reflection coating (ARC) layer. A plurality of such backplane bonded solar cells may be connected and assembled to form a solar photovoltaic module by connecting the solar cells from the extended conductive interconnects at the back plane edges or through the conductive material filled through holes/vias/openings on the backside of the back plane.

A thin (generally having a thickness less 10 μm and in the range of about 0.1 μm to about 2 μm in some embodiments) interdigitated emitter and base metal grid layer is formed on the backside of the solar cell by blanket metal coating process, such as metal physical-vapor-deposition (e.g., plasma sputtering or evaporation of aluminum or aluminum silicon alloy), and metal patterning processes, such as aligned pulsed laser metal ablation. Alternative patterned metal coating processes include, but are not limited to, screen-printing, inkjet-printing and metal etching with patterned masking layer.

The backplane assembly comprises a backplane plate, an optional encapsulating and insulating adhesive material, and a thick interdigitated emitter and base metal grid layer (made in some embodiments of a high-conductivity and low cost metallic foil such as aluminum or aluminum alloy foil but also may be any suitably electrical conductive material such as copper). The patterned metal layer is encapsulated or bonded to the backplane by the insulating adhesive layer. The backplane in some embodiments may be made of dielectric materials including, but not limited to, soda lime glass, plastics and composites of dielectric materials, or any other material with suitable structural strength and light trapping abilities. Alternatively, the backplane may be made of dielectric coated metallic materials such as aluminum coated with anodized aluminum. The metal grid layer may be formed by laminating pre-made metal strips on the back plane or by patterning/slitting a metal foil, such as aluminum or aluminum alloy foil that is pre-laminated on the back plane. Examples of the insulating adhesive materials include common solar photovoltaic module encapsulant materials such as ethylene vinyl acetate (EVA) from various manufacturers and Oxidized LDPE (PV-FS Z68) from Dai Nippon Printing (DNP).

The aligned joining/bonding of the solar cell and the backplane is made by the conductive adhesive plugs/bumps/posts and a partially melted and reflowed encapsulant dielectric layer between the patterned metal surfaces on the backplane and solar cell sides. The interdigitated metal grids on the solar cell and on the backplane may be aligned and attached in a parallel or orthogonal arrangement. The patterned dielectric layer may be positioned on either the solar cell metal surface or the backplane metal surface before the joining of the solar cell and the backplane. The opened areas of the patterned dielectric layer between the two metal layers are filled with a conductive adhesive material to provide the electrical conduction and adhesive bonding.

The disclosed solar modules, the backplane bonded solar cells, and backplanes may be mechanically flexible or semi-flexible to enable conformal mounting on a non-flat or curved surface of an object, such as a contoured building wall or automotive body. Further, the disclosed solar modules, the backplane bonded solar cells, and backplanes may have a plurality of light transmission openings allowing for light to partially pass through for see-through applications such as building integrated photovoltaic (BIPV) and automotive applications.

FIGS. 1 through 3D are schematic drawings of a TFSS-based back-contact solar cell with patterned thin metal electrodes, a backplane with patterned thick metal electrodes (e.g., preferably a low-cost high-conductivity material such as aluminum or an aluminum alloy), and the joining/bonding process to make a fully fabricated back-contact solar cell with backplane support and reinforcement. In this embodiment, the metal electrodes on the backplane are aligned parallel to the metal electrodes on the solar cell and the metal electrodes on the backplane and on the solar cell are fully embedded in the bonded and encapsulated structure. Embedded electrodes allow the cell to go through post-template-release processing steps, such as surface texturing, passivation and anti-reflection coating, without any exposure of the embedded metal electrodes to the texturing chemicals and decreased risk of cross-contamination from the embedded metal electrodes to the process tools.

FIG. 1A is a schematic drawing of a partially fabricated TFSS-based back contact solar cell before release from a reusable template. Solar cell substrate 6 is a thin (e.g., 1 µm to ~100 µm) layer of epitaxial silicon grown on porous silicon release layer 4 on reusable silicon template 2 using known methods for depositing epitaxial silicon such as trichlorosilane (TCS), dichlorosilane (DCS), or Silane. The term substrate in this disclosure refers to a thin plate, most likely made of semiconductor materials such as silicon, which has lateral dimensions (diameter, length, width) much larger than its thickness. The term template in this disclosure refers to a structure that the substrate is originally attached to and is separated/released from to create the solar cell. A template may be used to produce a plurality of substrates and is usually thicker and more rigid than the stand-alone substrate. For example, a reusable silicon template may be made of a silicon wafer in a circular shape with a diameter of 100 mm to 450 mm, or a square shape with rounded corners, or a full square shape with side dimensions in the range of 100 mm up to several hundred millimeters—common dimensions for a solar cell application are 125 mm×125 mm, 156 mm×156 mm, or 210 mm×210 mm. The thickness of the reusable template may be in the range of 200 um to a few millimeters while the thickness of the thin-film-silicon-substrate (TFSS) may be in the range of about one micron to a few hundreds of microns.

The attachment between the substrate and the template is through a thin mechanically-weak layer made of the same or different materials as the substrate and the template. For example, a porous silicon layer having a bi-layer (or trilayer or grade porosity) structure with a higher porosity (60%~80%) sub-layer on the template side and a lower porosity (10%~30%) sub-layer on the TFSS side. The low porosity layer serves as the seed layer to facilitate the low-defectivity mono-crystalline epitaxial silicon growth and the high porosity layer is used facilitate the separation of the TFSS and template. Structural and process details are found in U.S. Patent Publication Nos. 2008/0264477 and 2009/0107545, which are hereby incorporated by reference in their entirety for all purposes as if set forth fully herein. International Patent Publication Nos. WO2011/072161 and WO2011/072179, which are hereby incorporated by reference in their entirety for all purposes as if set forth fully herein, disclose specific structures, methods and process flows for making back contact silicon solar cells. And while the embodiments of this disclosure are primarily described using thin silicon cells produced using reusable silicon templates and epitaxial silicon deposition as an example, the disclosed subject matter is applicable to thin semiconductor cells produced by other methods such as cleaving thin silicon from bulk wafers and ingots using methods such as proton implantation and stress-induced cleavage methods.

Figure 1B:
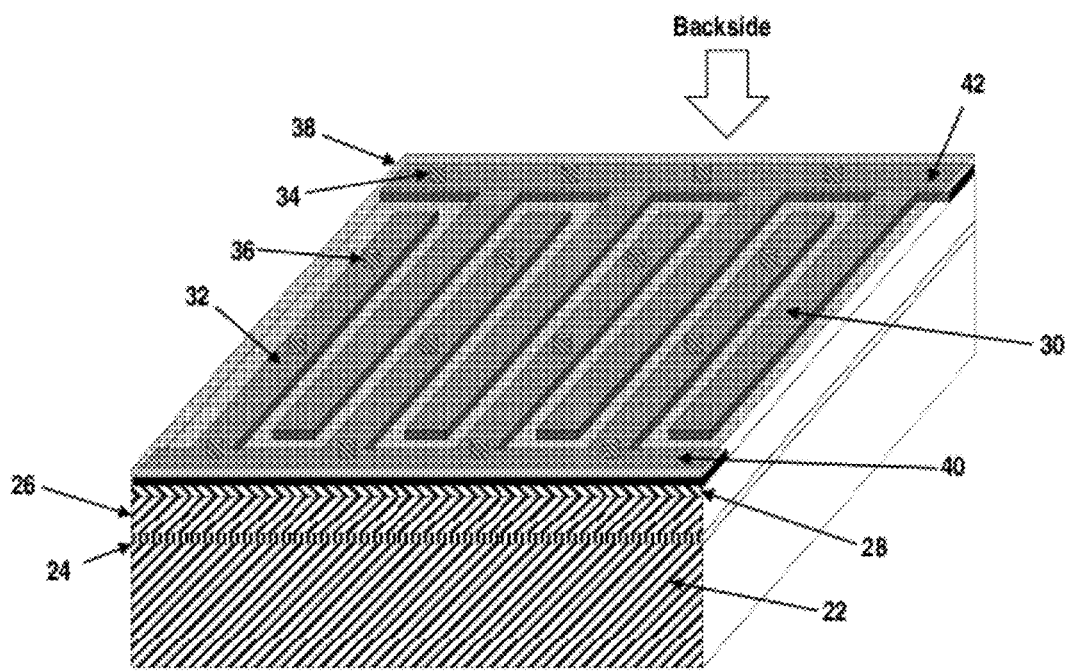

FIG. 1A illustrates a section of a back contact solar cell substrate, in which both polarities (base and emitter) of metal electrodes are on one side. Before releasing/separating/cleaving solar cell substrate 6 from reusable template 2 (or from a host wafer), localized emitter doped layer 8, base metal electrodes 10, emitter metal electrodes 12, dielectric adhesive layer 18, base conductive posts 14, and emitter conductive posts 16 are formed on the backside of the substrate (the top side as shown in FIGS. 1A and 1B). As shown, the substrate has doped emitter and base contact regions; however, the epitaxially-grown silicon TFSS may or may not have one or a combination of in-situ bulk base doping, back surface field (BSF) doping, front surface field (FSF) doping, and in-situ emitter doping, as part of the epitaxial growth process.

Although, the specific embodiments discussed herein are with n-type bulk base doping using phosphorous with a boron p-type emitter, the methods are equally applicable to any combination of doping which form a solar cell. Because key embodiments of the present disclosure focus on backplane cell support, reinforcement, and interconnects, the specific doping regions, surface passivation layers, back mirror layer, and front anti-reflection coating (ARC) layers are not shown in the figures for simplicity of the drawings and descriptions.

Important elements shown in FIG. 1A are the substantially parallel busbarless interdigitated emitter (12) and base (10) metal electrodes, the dielectric bonding and encapsulation layer (18), and electrically conductive base (14) and emitter (16) joining posts. The metal layer is preferably deposited by physical vapor deposition (PVD) processes such as plasma sputtering or evaporation and may be patterned by one of the following three methods: (1) using shadow mask during metal deposition; (2) shallow laser scribing such as laser ablation; or (3) metal chemical etching with printed etching masking layer. Metallic material options include, but are not limited to, aluminum or aluminum-silicon alloy because these materials have little or no contamination concerns in downstream solar cell processing—including processing involving plasma-enhanced chemical vapor deposition (PECVD) of thin dielectric layers and wet texturing process. These materials also establish low-resistivity contacts to both n+ and p+ silicon contact regions and act as relatively good optical reflectors to assist with cell light trapping. The thickness of the deposited metal layer on the cell is typically less than 10 μm and is in the range of 0.1 μm to 2 μm in the embodiment shown. The length of the interdigitated electrodes is comparable to the solar cell size, which may be 125 mm or 156 mm long. The spacing between adjacent base and emitter electrodes is, for example, in the range of 0.5 mm to 2 mm. The electrode width is preferred to be wider in order to reduce resistive ohmic losses. However, depending on the tolerance of the backplane bonding alignment requirement, the gap between adjacent electrodes may be from about 10 μm to 1 mm. To reduce the surface losses due to busbar electrical shading and to fully extract current from all the surfaces areas, the metal layout shown in this design is busbarless (i.e., there are no busbars on the cell).

Optionally, upon patterning the thin metal layer, a thin dielectric insulating layer (18) is deposited on the metal electrodes to cover the entire surface area except the local openings on the electrodes for making the contacts (shown as conductive base posts 14 and conductive emitter posts 16). This optional and not required insulating layer may be screen-printed from a paste phase or inkjet-printed from a liquid phase followed by drying and curing. Alternatively, the dielectric layer may be a PVD silicon nitride or oxide layer that is patterned by laser ablation or chemical etching.

Conductive emitter posts 16 and conductive base posts 14 are then formed by applying electrically conductive pastes using screen-printing, inkjet-printing or direct liquid/paste dispensing. Application of the electrically conductive plugs (interchangeably referred to as posts herein) may be performed by adding such plugs either to the cell or to the backplane interdigitated metal fingers. For example, after drying and curing the optional deposited dielectric layer, the conductive posts may be made by one of the following methods: (1) metal plating; (2) conductive material inkjet-printing or dispensing followed by drying; or (3) screen printing a conductive adhesive layer. Conductive post shapes include line-segments, prisms, or cylindrical or elliptical shapes. The height of the conductive posts is larger than the optional dielectric layer thickness so that the conductive posts stick out from the optional dielectric layer that surrounds them. As an example, if the dielectric insulating layer is 100 μm the post height is preferred to be in the range of at least 100 um to 200 um.

FIG. 1B is a section of an alternative back contact solar cell before the TFSS is released in which base and emitter thin-metal busbars are employed to provide redundancy that allows current to flow in case electrical continuity is broken because of mechanical or electrical failures. Solar cell substrate 26 is positioned on porous silicon layer 24 which is positioned on reusable silicon template 22. The top side of cell as shown is the back metal contact side (opposite the sunny side) with thin emitter doped layer 28, base metal electrodes 30, emitter metal electrodes 32, dielectric adhesive layer 38, base conductive posts 34, emitter conductive posts 36, base metal busbar 42, and emitter meal busbar 40.

The busbars may be made of the same material as the interdigitated electrodes and the busbar width may be similar in size to the emitter and base metal grids so that they would not affect full and uniform current extraction. Conductive adhesive posts may be placed on the busbars and such post density on the busbars is preferably larger than on the metal grids. The rest of structural design and fabrication processes of this solar cell with thin metal busbars are similar to that as the one described in FIG. 1A.

Figure 2:
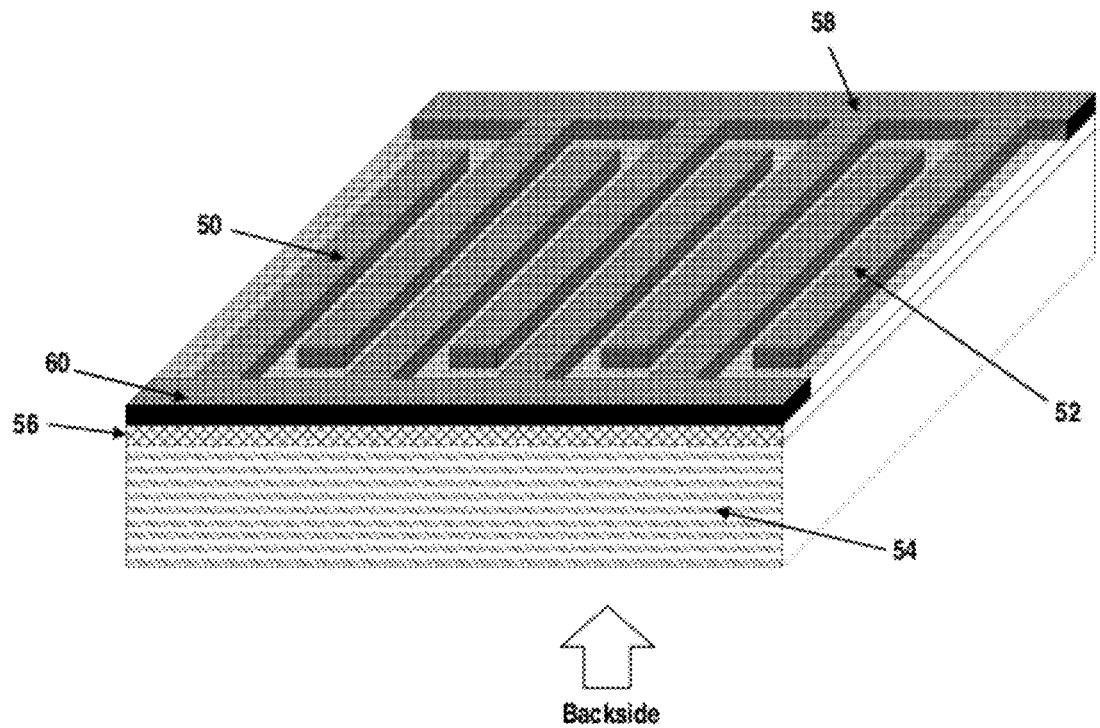
FIG. 2 illustrates a cross section of a back plane.
Figure 3A:
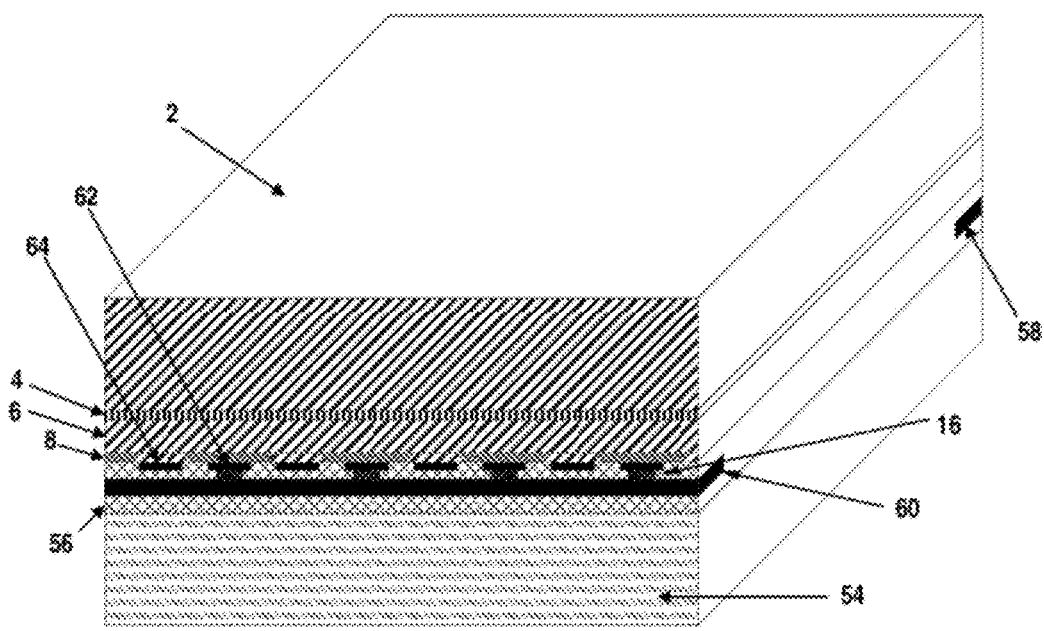
FIGS. 3A through 3D are diagrams of a solar cell, highlighting the backplane, after key fabrication process steps.
Figure 3B:
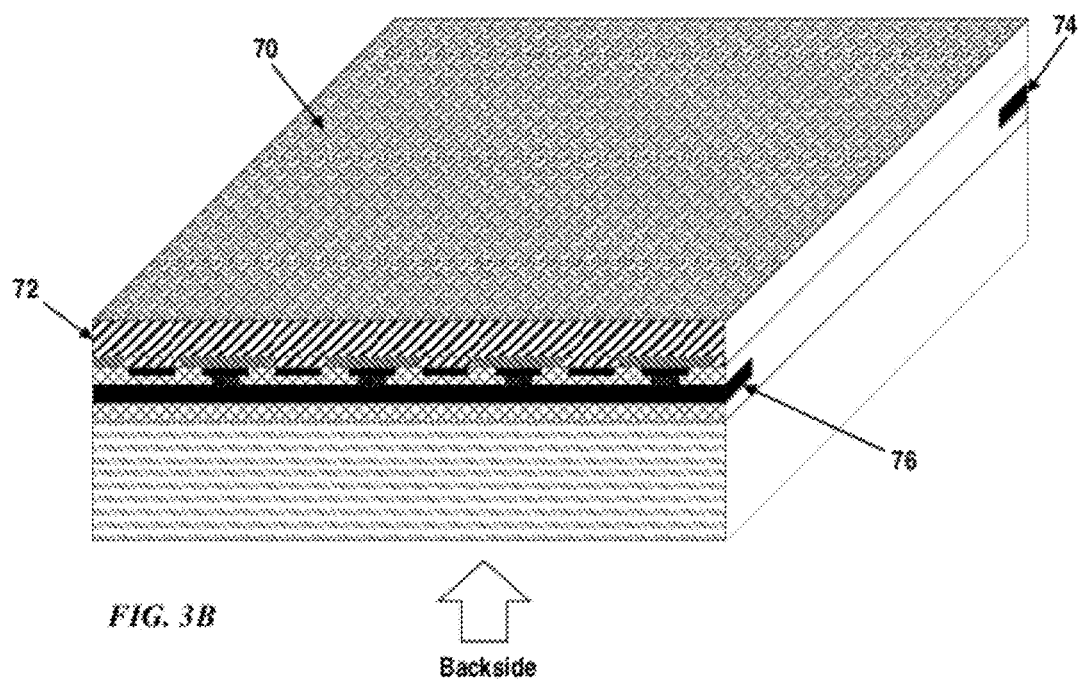
Figure 3C:
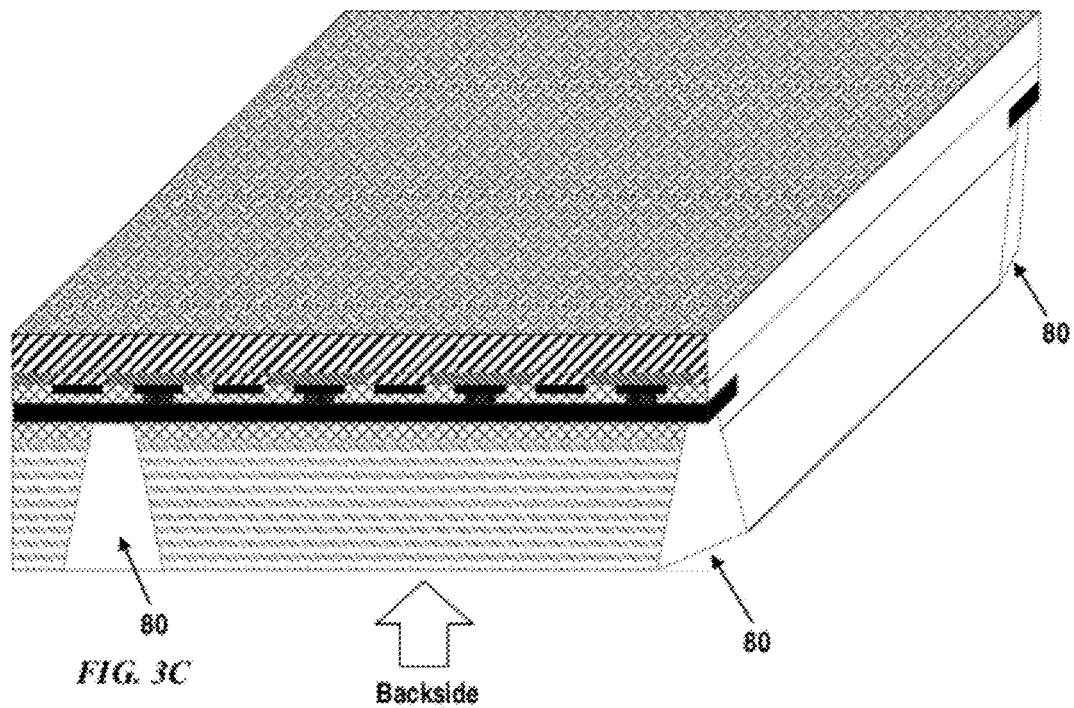
Figure 3D:
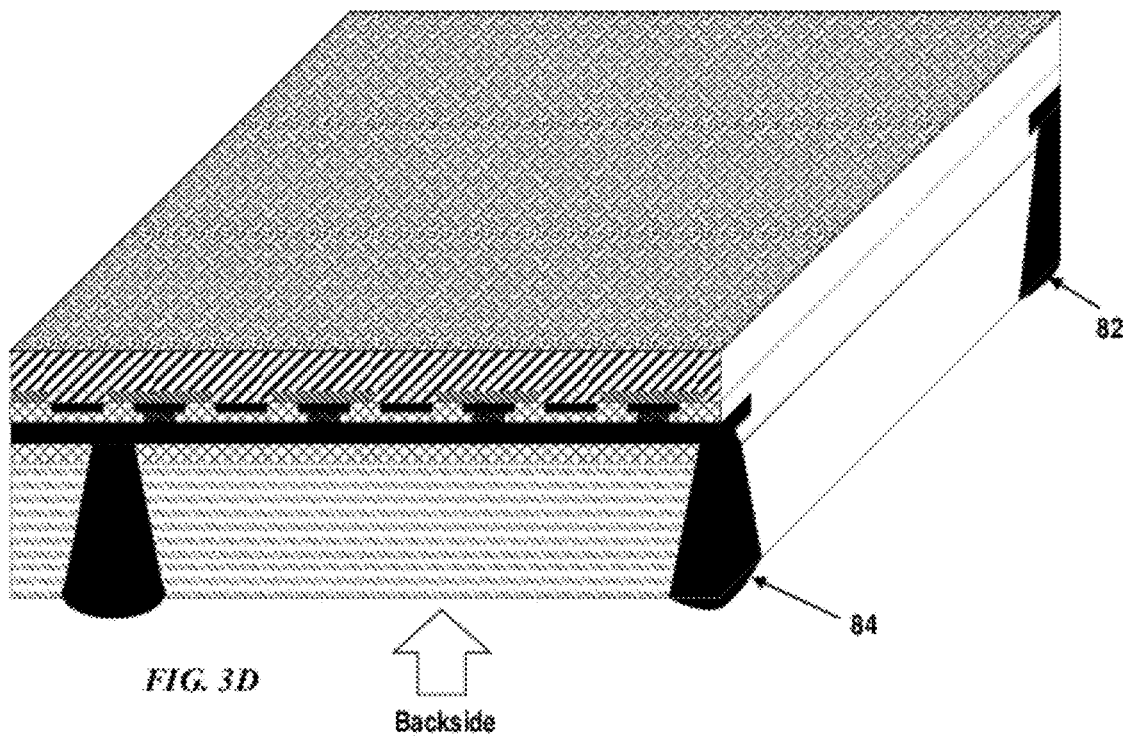

FIGS. 2 through 3D are diagrams of the solar cell, highlighting the backplane, after key fabrication process steps. The structural features depicted in the cross sectional diagrams of FIGS. 2 through 3D are consistent unless otherwise noted. In FIGS. 2 through 3D the cross-sectional diagrams of the solar cell show the cell with the frontside (sunnyside) facing upwards and the backside (non-sunny/contact side) facing downwards.

FIG. 2 illustrates a section of a back plane comprising backplane 54, also referred to as the backplane plate, bonded/mounted to an interdigitated thick metal layer comprising thick base electrodes 52, thick emitter electrodes 50, emitter busbar 60, and base busbar 58. The interdigitated metal grids are parallel and size-comparable to the interdigitated metal pattern shown in FIGS. 1A and 1B. The backplane is preferably electrically insulating and mechanically rigid and also have a relatively low coefficient of thermal expansion (CTE), low cost, high chemical resistance, and high thermal stability (up to 150° to 200° C., for instance). Examples of the backplane material include, but are not limited to, soda lime glass and certain plastics. The thickness of the backplane is preferably in the range of about 0.25 mm to 3 mm, and more preferably in the range of 0.25 mm to 0.75 mm), with a lateral dimension no less than the silicon solar cell to be bonded.

The patterned metal layer may be pre-fabricated and attached to an insulating adhesive layer and then laminated as it is on the back plane as shown in FIG. 1(c). Alternatively, an insulating adhesive & encapsulant layer, shown as layer 56 in FIG. 2, such as EVA, PV-grade silicone or PV-grade Z68, may be laminated on the backplane surface. Then a metal foil, such as Al or Al alloy foil, may be laminated on top of the adhesive layer. The thickness of the metal layer is preferably in the range of 25 μm to 150 μm, which is much thicker and thus much more electrically conductive than the thinner metal layer deposited on the solar cell. Using this design, the global electrical current and voltage extraction and conduction are primarily performed by the relatively thick patterned metal layer on the backplane. In the next step, the metal foil may be patterned and edge trimmed by one of the following methods: (1) laser scribing with subsequent cleaning for metal debris removal; (2) chemical etching with a patterned masking layer; (3) mechanical stamping or die-cutting. After patterning the metal foil into an interdigitated pattern, the backplane assembly may be heated to partially melt and re-flow the insulating adhesive and encapsulant layer in order to fill and encapsulate the space between the patterned metal grids.

FIG. 3A illustrates a section of the bonded backplane and the solar cell in FIG. 1A. As such, structural features depicted in the cross sectional diagrams of FIGS. 1A and 3A are consistent unless otherwise noted. The solar cell with attached template of FIG. 1A is first placed on top of the backplane of FIG. 3A and the metal pattern on the backplane is aligned in parallel to the metal pattern on the solar cell (in other words, the interdigitated electrodes are aligned in parallel) and bonded to create a spatially transformed cell interconnect on the backplane. The bonding or lamination process may be conducted in vacuum environment to eliminate air bubble trapping between the backplane and the solar cell and a controlled pressure may be applied during the bonding in order to make full surface contact.

After the initial bonding (or lamination/encapsulation) the assembly may be slightly heated through hotplate contact or by an infrared lamp. As a result, the conductive posts will make full electrical contacts to the metal layers, shown in FIG. 3A as base contact 64 and emitter contact 62, and the partially melted and re-flowed insulating adhesive layer will bond the two plates together.

FIG. 3B illustrates a section of the solar cell after processing the frontside (sun-facing, sunny side) silicon surface. And as shown in FIG. 3B, the fabricated solar cell has no metal grids on its frontside/sunnyside surface (shown as the top surface). After bonding or lamination of the backplane and the solar cell with attached reusable host template, the template is released from the bonded assembly. For example, U.S. Pat. Pub. Nos. 2010/0022074, 2010/0279494, and 2011/0021006 disclose releasing methods and apparatus and are hereby incorporated by reference in their entirety for all purposes as if set forth fully herein.

After releasing the laminated and bonded backplane/cell assembly from the template, porous silicon debris and quasi-monocrystalline silicon (QMS) layer at the thin film silicon substrate (TFSS) and template interface are cleaned and removed using controlled silicon etching process, such as diluted KOH or TMAH or $HF+HNO_3$ based silicon etching. The cleaned silicon template will be used again in the next cycle of forming porous silicon layers and growing epitaxial silicon layer.

The exposed silicon sunny side surface of the solar cell will then go through (1) a surface texturing process to create textures for effective light trapping and reduced optical reflection losses; (2) a surface passivation and anti-reflection coating (ARC). Thus, as shown in FIG. 3B, creating textured and passivated and ARC coated silicon surface 70 on the solar cell TFSS 72.

If the interconnecting metal layers are fully embedded and encapsulated in the bonded and laminated assembly, as shown by embedded base busbar 74 and embedded emitter busbar 76 in FIG. 3B, the described subsequent process steps may be performed without certain associated problems. However, in cases where the interconnecting metal layers extend beyond the edges of the bonded and laminated assembly, as is described in further detail below, the extended metal surfaces should be coated with insulating protective encapsulant layer to prevent the metal surfaces from exposure to the silicon wet etching and PECVD passivation/ARC processes to eliminate potential metal etching and cross contaminations. Further, the silicon wet etching cleaning and texturing processes may be performed in a single-side in line process tool or in a batch immersion processing tool. The surface passivation and ARC layer coating may be deposited in a PECVD tool by depositing a thin layer of silicon nitride to cover the textured silicon surface.

FIG. 3C illustrates a section of the solar cell after forming backplane through holes 80 from the cell back side. Such holes are preferably formed in the backplane material using mechanical drilling, laser drilling, or another method before the backplane is laminated with the encapsulant as described above. The through-hole openings expose the emitter and base busbars from the backside for interconnect. As an example, the through holes may be formed by one of the following methods: (1) laser drilling following by debris removal; (2) mechanical drilling, such as ultrasonic glass drilling; (3) controlled chemical etching.

Further, the backplane throughholes are preferably tapered. For example, the opening on the backplane surface may be in the range of 1 mm to 5 mm and the opening at the metal interface may be 10% to 50% smaller than the outer opening. The encapsulant covering the metal electrodes in the hole regions, insulating adhesive & encapsulant layer 56, may be removed using a mechanical or thermal method at the end of cell processing in order to expose the metal electrodes in the through-holes for subsequent cell testing and sorting and module packaging.

FIG. 3D illustrates a section of the fully fabricated solar cell after filling the backplane through-holes with a conductive material, such as a conductive paste, and forming vias, shown as emitter electrode 84 and base electrode 82. For example, one of the following methods may be used to fill the through holes: (1) screen printing a conductive paste that contains metal particles followed by a drying process; (2) position/location controlled dispensing or inkjet printing of a liquid that contains metal particles into the holes followed by a drying process; or (3) electroplating metal plugs to fill the holes. The solar cell is now ready for further processing such as forming interconnections with additional solar cells and module assembly.

Figure 4:
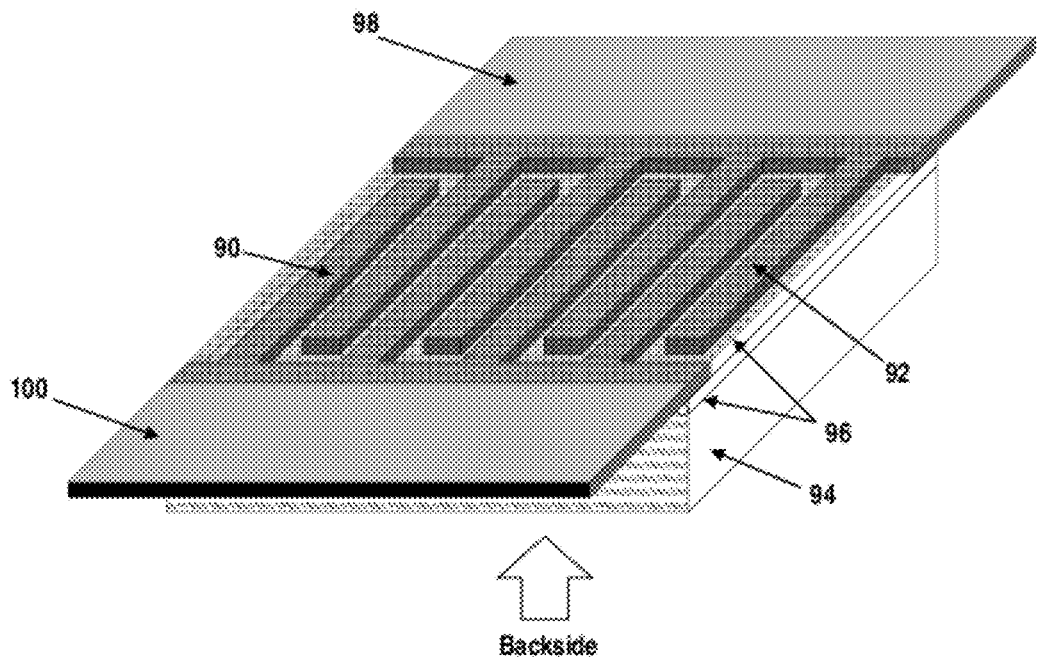
FIG. 4 illustrates a cross section of an alternative backplane embodiment.
Figure 5A:
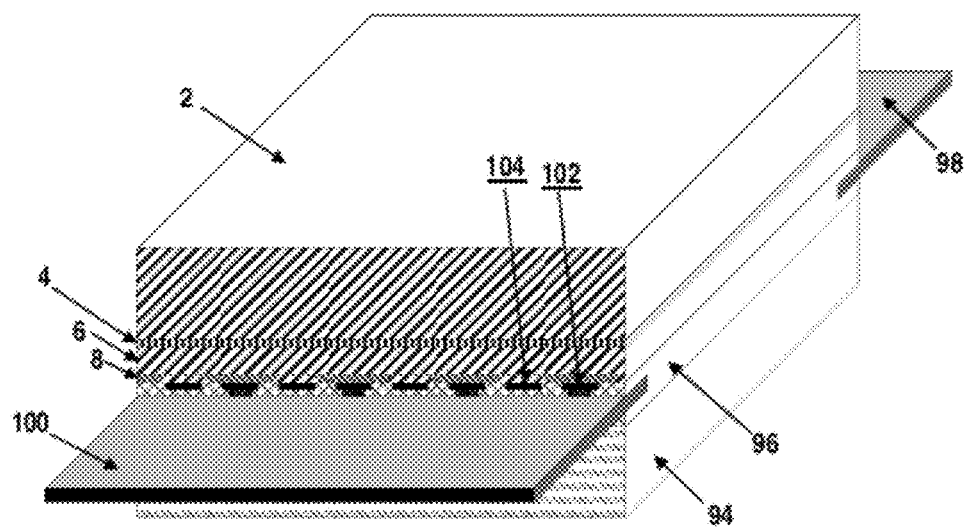
FIGS. 5A through 5B are diagrams of a solar cell, highlighting the backplane, after key fabrication process steps.
Figure 5B:
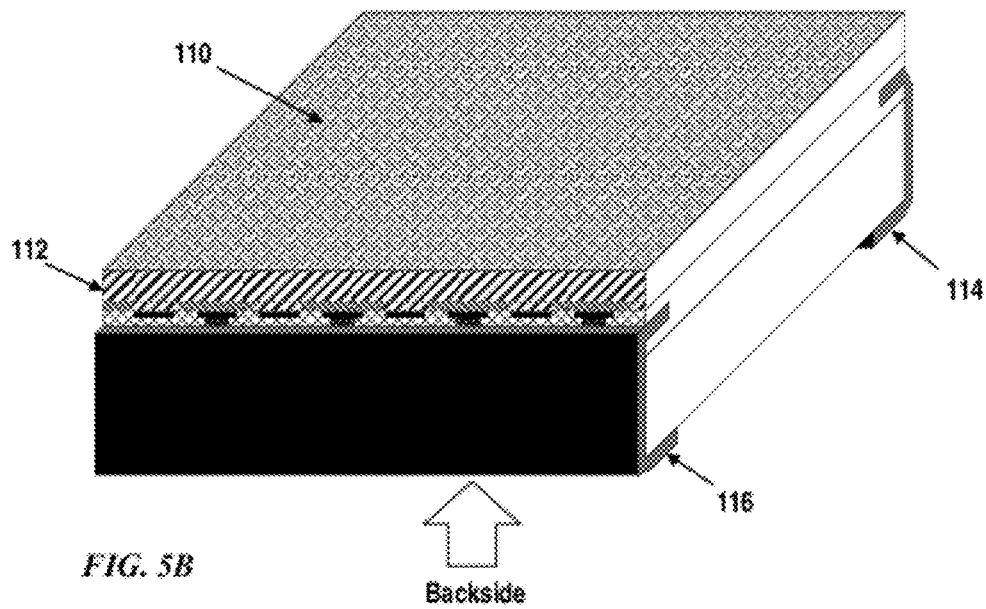

FIGS. 4 through 5B are diagrams of the solar cell, highlighting the backplane, after key fabrication process steps. The structural features depicted in the cross sectional diagrams of FIGS. 4 through 5B are consistent unless otherwise noted. In FIGS. 4 through 5B the cross-sectional diagrams of the solar cell show the cell with the frontside (sunnyside) facing upwards and the backside (non-sunny/contact side) facing downwards.

FIGS. 4-5B illustrate the schematic drawings of an alternative TFSS-based back-contact solar cell. FIG. 4 illustrates a section of a back plane comprising backplane 94, also referred to as the backplane plate, bonded/mounted to an interdigitated thick metal layer comprising thick base electrodes 92, thick emitter electrodes 90, extended emitter busbar 100, extended base busbar 98, and optional insulating adhesive and encapsulant layer 96. The solar cell structure in FIG. 4 is similar to the one in FIG. 2 except the metal busbars on the backplane are extended beyond the cell and backplane boundary, to be bent and wrapped-around the backplane edges towards the backplane backside to provide backside cell base and emitter contact electrodes for the cell and for inter-cell electrical interconnection within a photovoltaic module assembly. In this embodiment, the metal electrodes on the backplane are aligned parallel to metal electrodes on the solar cell.

FIG. 4 illustrates a section of an alternative backplane embodiment with a bonded interdigitated metal layer. Here, the interdigitated metal grids on the backplane are parallel to the metal grids on the solar cell and the emitter and base meal busbars are extended out to the backplane edges. The edge-extending length of the metal busbars are preferably long enough to wrap around the backplane edge and provide space for making contacts either along the edge sidewalls or on the backside of the backplane. The edge extension of the busbars may in the range of about 2 mm to 15 mm. And the thickness of the metal layer on the backplane is in the range of 25 μm to 150 μm, which is thicker than the metal electrode layer on the solar cell. For example, the patterned metal layer on the backplane may be made by one of the following methods: (i) The patterned metal layer may be pre-fabricated and attached to an insulating adhesive layer and then laminated as it is on the backplane; (ii) An insulating adhesive & encapsulant layer, such as EVA, PV silicone or Z68, may be applied and laminated on the backplane surface first. Then a metal foil, such as an Al or Al alloy foil, may be laminated on top of the insulating adhesive layer. In the next step, the metal foil is patterned by one of the following methods: (i) laser scribing with subsequent cleaning for metal debris removal; (ii) chemical etching with a patterned masking layer; (iii) mechanical stamping or die-cutting. During the patterning process, the extended edges and exposed sections of the metal busbars may be temporarily supported with edge spacers that are mounted flush against the backplane edges. Therefore, the extended busbars are not overhanging during the metal patterning process. The adjacent finger spacing of the metal electrodes may be in the range of 0.5 mm to 4 mm, which is comparable to the thin metal electrodes on the solar cell. After patterning and bonding to the metal layer, the backplane assembly may be heated to melt and reflow the insulating adhesive layer in order to fully or partially fill the space between the patterned metal grids.

FIG. 5A illustrates a section of the backplane in FIG. 4 bonded with the solar cell in FIG. 1A. As shown and described in 3A, the solar cell with attached template is first placed on top of the backplane and the metal pattern on the backplane is aligned parallel to the metal pattern on the solar cell. The lamination bonding is preferably performed in a vacuum environment to eliminate air bubble trapping between the backplane and the solar cell and a controlled pressure may also be applied during the bonding in order to create full surface contact. After the initial bonding, the assembly is optionally slightly heated by hotplate contact or with an infrared lamp. As a result, the conductive posts will make full electrical contacts to the metal layers, shown in FIG. 5A as base contact 104 and emitter contact 102, and the melted and re-flowed adhesive dielectric layer will bond the two plates together.

FIG. 5B illustrates a section of a fabricated solar cell with bent emitter busbar 116 and bent base busbar 114 wrapped-around the backplane edges. As shown in FIG. 5B the fabricated solar cell has no metal grids on its frontside surface. The extended busbars are shown as bent and wrapped around the backplane edges. Process-compatible insulating adhesives such as a suitable encapsulant (e.g., EVA or Z68) are used to bond the ribbon edges to the backplane edge surfaces and also cover the exposed surfaces of the metal ribbons to enable subsequent wet and plasma processing steps. The edge-sealing insulating adhesives may be applied by dispensing, dipping, or spraying, or direct application and lamination of slivers of the encapsulant material. Examples of the edge-sealing insulating adhesives include EVA, Z68, or PV silicone solvent solutions. Protection of exposed metal surfaces with encapsulant adhesive is used to prevent the metal surface from exposure in the silicon wet etching and PECVD process in order to eliminate potential metal cross contaminations.

In the next step, the attached reusable template is released from TFSS 122. After releasing the cell/backplane assembly from the host template, porous silicon debris and quasi-monocrystalline silicon (QMS) layer at the TFSS and template interfaces are cleaned and removed in controlled silicon etching process, such as diluted KOH or TMAH or HF+$HNO_3$ based silicon etching. The cleaned silicon template will be used again in the next cycle of forming porous silicon layers and growing epitaxial silicon layer.

The exposed silicon surface of the solar cell will then go through (1) a surface texturing process to create textures for effective light trapping and reduced optical refection losses, and (2) a thin surface passivation and anti-reflection coating. The silicon wet etching cleaning and texturing process may be conducted in a single-side in-line process tool or a batch immersion processing tool. The surface passivation and ARC layer may be deposited in a PECVD process by depositing a thin layer of silicon nitride to cover the textured silicon surface—textured and passivated and ARC coated silicon surface 110 on the solar cell TFSS 112, as shown in FIG. 5B. The solar cell is now ready for further processing such as forming interconnections with additional solar cells and module assembly.

FIGS. 6A through 6E are diagrams of the solar cell, highlighting the backplane, after key fabrication process steps. The structural features depicted in the cross sectional diagrams of FIGS. 6A through 6E are consistent unless otherwise noted. In FIGS. 6A through 6E the cross-sectional diagrams of the solar cell show the cell with the frontside (sunnyside) facing upwards and the backside (non-sunny/contact side) facing downwards.

FIGS. 6A-E illustrate the schematic drawings of a TFSS-based back-contact solar cell with patterned thin metal electrodes (e.g., sputtered or evaporated aluminum), a backplane with patterned thick metal electrodes and their joining/bonding process to make a fully fabricated back-contact solar cell with backplane supports. In this embodiment, the metal electrodes on the backplane are orthogonally aligned to the metal electrodes on the solar cell. Further, the metal electrodes on the backplane and on the solar cell are fully embedded and encapsulated in the bonded structure and within the insulating encapsulant to enable completion of the post-template-release processing steps, such as surface texturing, and passivation & anti-reflection coating.

Figure 6A:
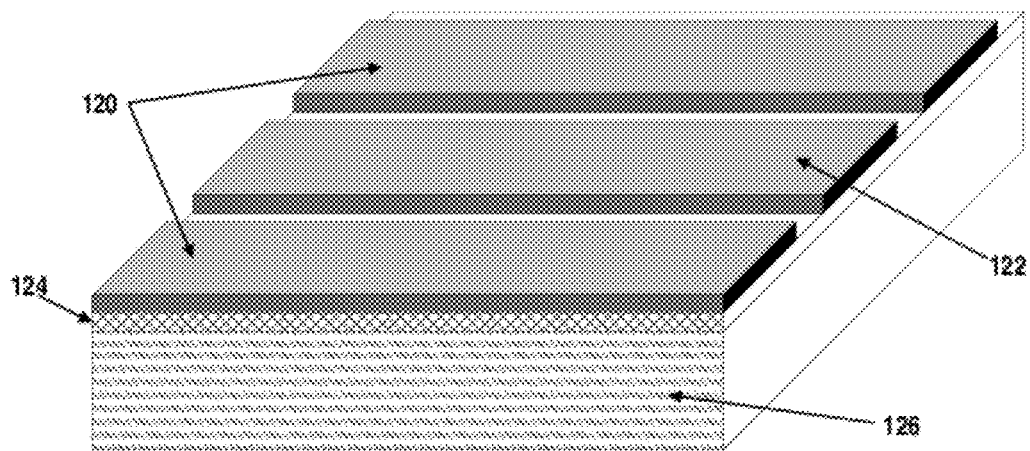
FIGS. 6A through 6E are diagrams of a solar cell, highlighting the backplane, after key fabrication process steps.

FIG. 6A illustrates a section of a back plane comprising backplane 126, also referred to as the backplane plate, bonded/mounted to thick base electrodes 122 thick emitter electrodes 120 by optional insulating and encapsulant layer 124.

Note the interdigitated metal grids on the backplane, thick base electrodes 122 thick emitter electrodes 120, are orthogonal to and wider than the interdigitated metal pattern on the solar cell shown in FIG. 1A, which is to be bonded to the backplane shown in FIG. 6A. Thus, because of orthogonal overlapping of the electrodes, the dielectric insulating layer on the solar cell in FIG. 1A should be robust in order to eliminate the potential counter electrode shorting. The dielectric layer is preferably a laminated, screen-printed, or an inkjet-printed insulating layer with a thickness of no more than 10 um. As a result, the conductive posts also needed to be taller than described for FIG. 1A so that the conductive posts may extend out from the insulating surface to allow for effective conductive bonding to the backplane.

Backplane 126 of FIG. 6A is preferably made of an electrically insulating and mechanically rigid material. It should also preferably have a relatively low coefficient of thermal expansion (CTE), low cost, high chemical resistance, and high thermal stability. Examples of backplane material include, but not limited to, soda lime glass and some plastics. The thickness of the back plane is in the range of 0.25 mm to 3 mm, preferably in the range of 0.25 mm to 0.75 mm, and its lateral dimension is no less than the silicon solar cell to be bonded. The thickness of the metal layer on the backplane is preferably in the range of 25 μm to 150 μm, which is thicker than the metal electrode layer on the solar cell. The patterned metal layer on the backplane can be made in one of the following methods: (1) The patterned metal layer may be pre-fabricated and attached to an insulating adhesive and encapsulant layer and then laminated as it is on the backplane. (2) An insulating adhesive layer, such as EVA, PV silicone or Z68, may be laminated on the backplane surface first then a metal foil, such as an Al or Al alloy foil, may be laminated on top of the adhesive layer. In the next step, the metal foil is patterned and edge trimmed by one of the following methods: (i) laser scribing with subsequent cleaning for metal debris removal; (ii) chemical etching with a patterned masking layer; (iii) mechanical stamping or die-cutting. (3) The metal grids may be formed by laminating parallel-aligned thin metal ribbons directly on the insulting adhesive layer. Examples of the thin metal ribbons include aluminum or aluminum alloy ribbons cut out from an aluminum (Al) or Al alloy foil, or Tin (Sn)-plated copper (Cu) ribbon (or tin-coated Al or tin-coated Al alloy). The width of the metal electrodes, thick base electrodes 122 thick emitter electrodes 120, is in the range of 1 mm to 10 mm, which is wider than the thin metal electrodes on the solar cell. After patterning and bonding the metal layer, the back plane assembly may be heated to partially melt and re-flow the adhesive layer in order to fully or partially fill the space between the patterned metal grids.

Figure 6B:
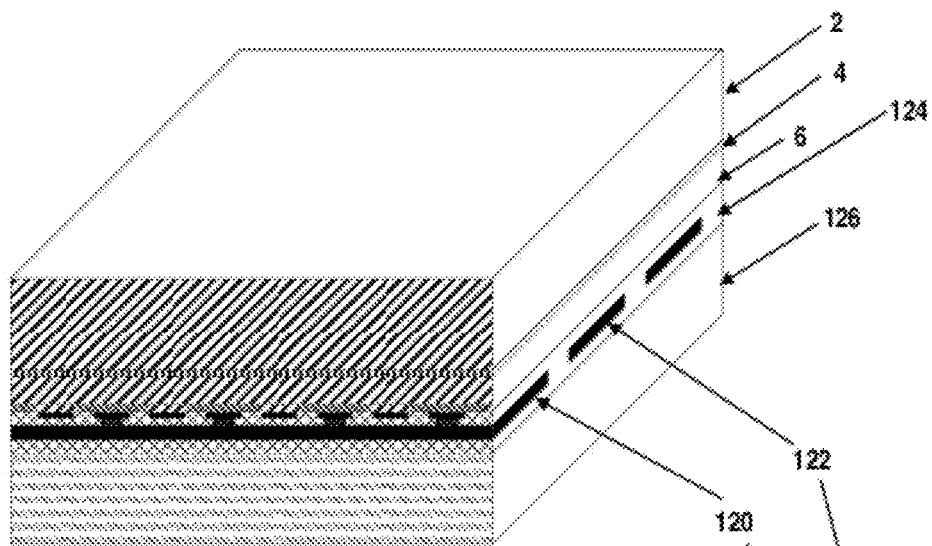

FIG. 6B illustrates a section of the bonded backplane of FIG. 6A and the solar cell in FIG. 1A and the described bonding process is similar to that of FIG. 3A except that the metal electrodes on the backplane are orthogonally aligned to the metal electrodes on the solar cell. The solar cell with attached template is first placed on top of the backplane and the metal pattern on the backplane is orthogonally aligned to the metal pattern on the solar cell. In other words, the interdigitated electrodes on the solar cell, base metal electrodes 10 and emitter metal electrodes 12, are aligned orthogonally to the interdigitated electrodes of the backplane, thick base electrodes 122 thick emitter electrodes 120, and bonded to create a spatially transformed cell interconnect on the backplane.

The bonding may be preferably conducted in a vacuum environment to eliminate air bubble trapping between the backplane and the solar cell, and a controlled pressure may also be applied during the bonding process in order to create full surface contact. After the initial bonding, the assembly may be slightly heated through contact with a hotplate or by an infrared lamp thermal radiation. As a result, the conductive posts will make full electrical contacts to the metal layers and the melted and re-flowed adhesive dielectric layer will bond the two plates together. The orthogonal aligned bonding of the two metal layers provides a space transformation from relative small metal grid pitch on the solar cell to the large metal pitch on the backplane. Therefore, backplane-to-cell alignment as well as the interconnections between solar cells may be conducted more conveniently with a coarse alignment with relatively large tolerance.

Figure 6C:
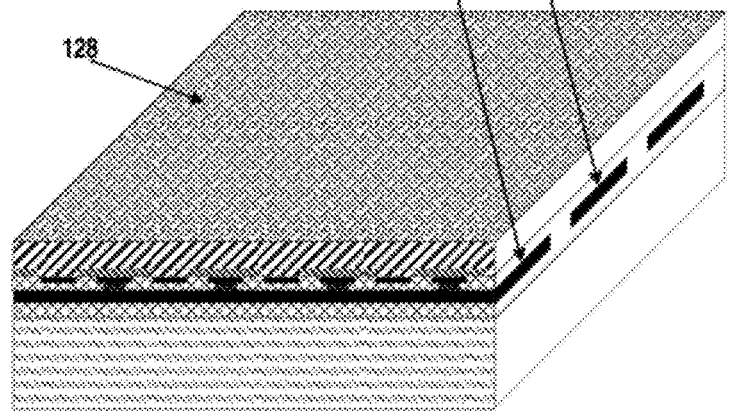

FIG. 6C illustrates a section of the solar cell after processing its sunny side silicon surface, thus the process described is similar to that of FIG. 3B. After bonding the backplane and the solar cell with attached reusable template, the template is released from the bonded backplane/cell assembly. After the release, porous silicon debris and quasi-monocrystalline silicon layer at the TFSS and template interfaces are cleaned and removed in controlled silicon etching process, such as diluted KOH or TMAH or HF+HNO$_3$ based silicon etching. The cleaned silicon template may be used again in the next cycle of forming porous silicon layers and growing epitaxial silicon layer. The exposed silicon surface of the solar cell will then go through (1) a surface texturing process to create textures for effective light trapping and reduced optical reflection losses and (2) a thin surface passivation and anti-reflection coating (ARC)—shown as textured and passivated and ARC coated silicon surface 128. In this case the interconnecting metal layers are fully embedded and encapsulated in the bonded assembly, and the said subsequent process steps may be performed without cross-contamination concern. The silicon wet etching cleaning and texturing process may be conducted in a single-side in-line process tool or in a batch immersion processing tool. The surface passivation and ARC layer coating may be performed in a PECVD tool by depositing a thin layer of silicon nitride to cover the textured silicon surface. In cases where the interconnecting metal layer is extended beyond the edges of the bonded assembly, the extended metal surfaces need to be protected with an insulating adhesive layer to prevent the metal surface from exposure to the silicon wet etching and PECVD process for eliminating potential metal cross contamination problems.

Figure 6D:
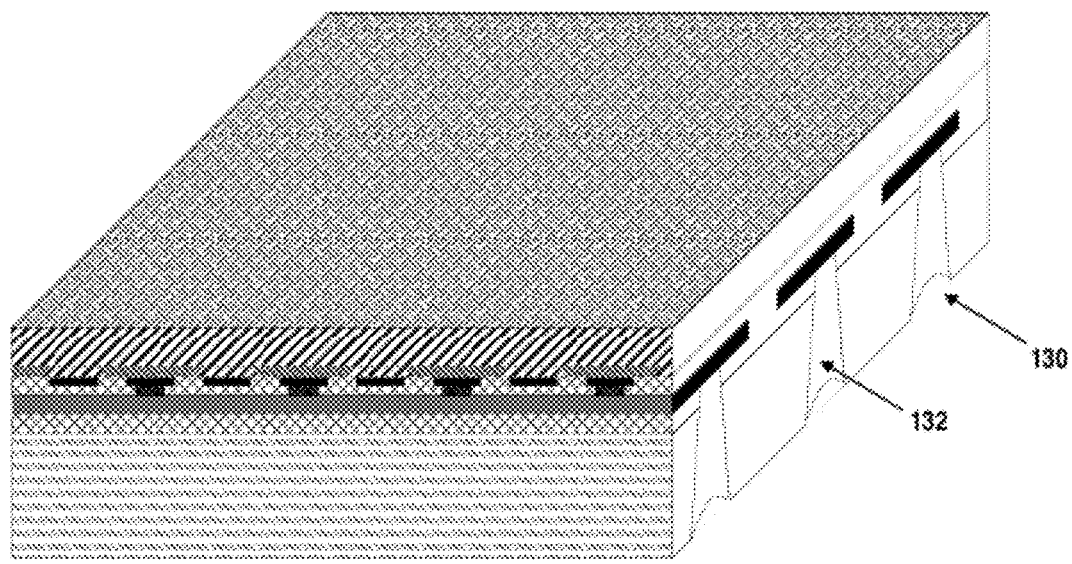

FIG. 6D illustrates a section of the solar cell after forming backplane though holes, base through-holes 132 and emitter through-holes 130, from cell back side. The through holes may be made by one of the following methods: (1) laser drilling followed by debris removal; (2) mechanical drilling, such as ultrasonic glass drilling; (3) controlled chemical etching. Alternatively, the through-holes may be pre-drilled before the stack bonding and lamination. Further, the backplane through holes are preferably tapered. For example, the opening on the backplane surface may be in the range from 1 mm to 5 mm, and the opening at the metal interface may be 10% to 50% smaller than the outer opening.

Figure 6E:
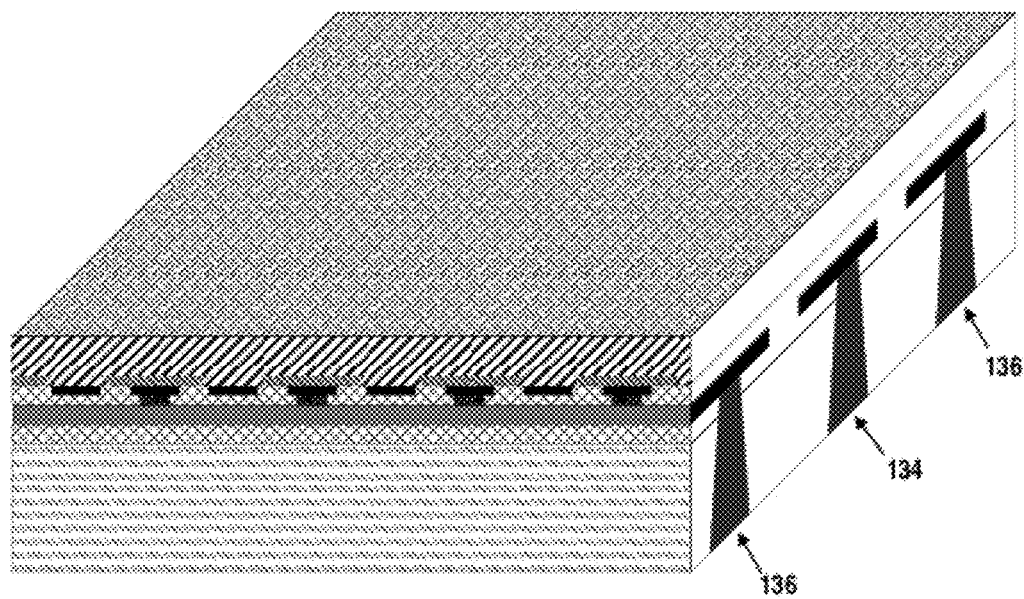

FIG. 6E illustrates base electrodes 134 and emitter electrodes 136 on the fully fabricated solar cell, created after filling the backplane through-holes with a conductive material such as an electrically conductive paste. One of the following methods may be used for providing the through hole filling: (1) screen printing a conductive paste that contains metal particles followed by a drying process; (2) position/location controlled dispensing of a liquid that contains metal particles into the holes followed by a drying process; (3) electroplating metal plugs to fill the holes. Interconnections among solar cell and module assembly of the solar cells will be described in the following paragraphs.

Figure 7A:
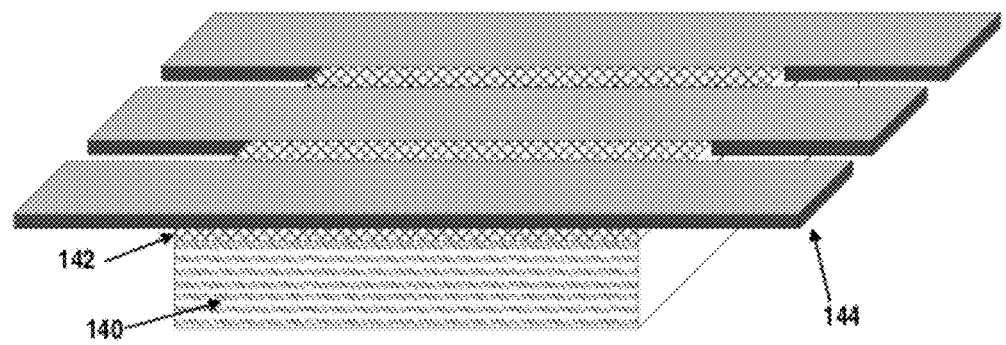
FIGS. 7A through 7C are diagrams of a solar cell, highlighting the backplane, after key fabrication process steps.
Figure 7B:
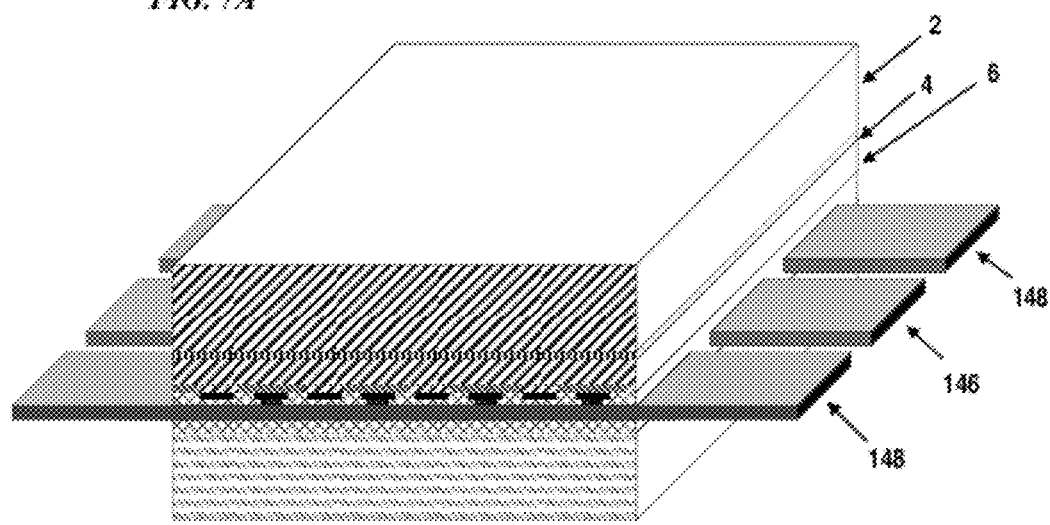
Figure 7C:
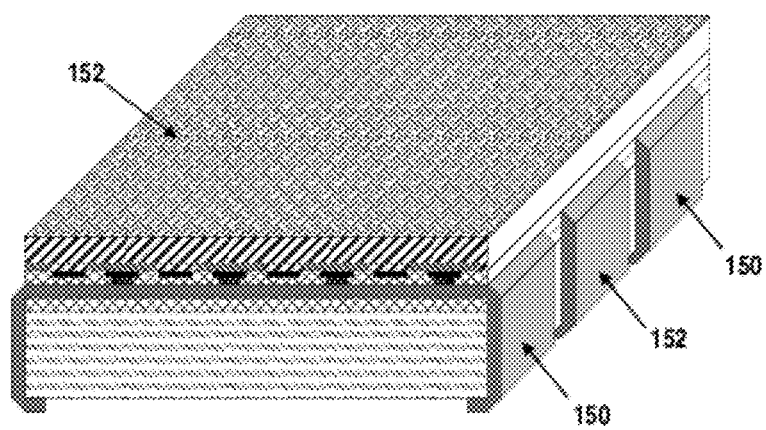

FIGS. 7A through 7C are diagrams of a solar cell and alternative backplane, after key fabrication process steps. The structural features depicted in the cross sectional diagrams of FIGS. 7A through 7C are consistent unless otherwise noted.

The solar cell structure in FIG. 7C is similar to solar cell depicted in FIG. 6 except the metal electrodes on the backplane are extended, bent, and wrapped-around the backplane edges to provide base and emitter electrical contacts and for inter-cell electrical interconnection within a photovoltaic module assembly. The metal electrodes on the backplane are orthogonally aligned to metal electrodes on the solar cell for spatial transformation of the cell interconnects.

As an alternative backplane design described in FIG. 6A, FIG. 7A illustrates a section of a backplane comprising backplane 140 (also referred to as the backplane plate) bonded to interdigitated metal ribbons with edge extension 144 by optional insulating adhesive 142. The interdigitated metal grids on the backplane are orthogonal to the interdigitated metal pattern on the solar cell shown in FIG. 1A, which is shown bonded to the backplane of FIG. 7A in FIG. 7B.

The thickness of the metal layer on the backplane is in the range of 25 μm to 150 μm, which is much thicker than the metal electrode layer on the solar cell. The edge-extending length of the metal ribbons is preferably long enough to wrap around the backplane edge and provide space for making contacts either along the edge sidewalls or one the backside of the backplane. The edge-extending length of the metal ribbon is preferably in the range of 2 mm to 15 mm. The patterned metal layer on the backplane may be made in one of the following methods: (1) The patterned metal layer may be pre-fabricated and attached to an insulating adhesive layer and then laminated as it is on the backplane. (2) An insulating adhesive layer, such as EVA, PV silicone or Z68, may be laminated on the backplane surface first. Then a metal foil, such as an Al or Al alloy foil, may be laminated on top of the adhesive layer. In the next step, the metal foil is patterned and edge trimmed by one of the following methods: (i) laser scribing with subsequent cleaning for metal debris removal; (ii) chemical etching with a patterned masking layer; (iii) mechanical stamping or die-cutting. During the patterning process, the edge extended sections of the metal layer may be temporarily supported with edge spacers that are flush mounted against the backplane edges. (3) The metal grids may be formed by laminating parallel-aligned thin metal ribbons directly on the insulating adhesive layer. Examples of the thin metal ribbons include aluminum or aluminum alloy ribbons cut out from an aluminum (Al) or aluminum alloy foil or Tin (Sn)-plated copper (Cu) ribbon (or tin-coated aluminum or tin-coated aluminum alloy). The width of the metal electrodes is in the range of 1 mm to 10 mm, which is wider than the thin metal electrodes on the solar cell. After patterning and bonding the metal layer, the backplane assembly may be heated to melt and reflow the insulating adhesive layer in order to fully or partially fill the space between the patterned metal grids.

FIG. 7B illustrates a section of the bonded backplane in FIG. 7A and the solar cell in FIG. 1A. The solar cell with attached template is placed on top of the backplane and the metal pattern on the backplane is orthogonally aligned to the metal pattern on the solar cell. The backplane lamination and bonding is preferably performed in vacuum environment to eliminate air bubble trapping between the backplane and the solar cell and a controlled pressure may also be applied to the assembly during the bonding in order to make full surface contact. After the initial bonding, the assembly may be slightly heated by hotplate contact or an infrared lamp. As a result, the conductive posts will make full electrical contacts to the metal layers and the melted and re-flowed adhesive dielectric layer will bond the two plates together forming base electrodes 146 and emitter electrodes 148. The orthogonal-aligned bonding of the two metal layers provides a space transformation from relative small metal grid pitch on the solar cell to the larger metal pitch on the backplane. Therefore, the backplane alignment and attachment of the backplane to the cell, as well as interconnection of solar cells in a module assembly, may be conducted more conveniently with coarse alignment with relatively large tolerance.

FIG. 7C illustrates a section of a fabricated solar cell with bent emitter electrodes 150 and bent base electrodes 152 bent and wrapped-around the backplane edges. Process-compatible protective encapsulation adhesives are used to bond the ribbon edges to the backplane edge surfaces and also cover the exposed the surfaces of the metal ribbons to enable the subsequent wet and plasma processing steps. Edge-sealing insulating adhesives may be applied by dispensing, dipping, or spraying, or direct application and lamination of slivers of the encapsulant material. Examples of edge-sealing insulating adhesives include EVA, Z68, or PV silicone encapsulants. Protective covering of exposed metal surfaces is to prevent the metal surface from exposure to the silicon wet etching and PECVD process to eliminate potential metal cross contaminations.

In the next step, the attached reusable template is released. After the template release, porous silicon debris and quasi-monocrystalline silicon layer at the TFSS and template interfaces are cleaned and removed in controlled silicon etching process, such as diluted KOH or TMAH or HF+HNO$_3$ based silicon etching. The cleaned silicon template may be used again in the next cycle of forming porous silicon layers and growing expitaxial silicon layer. The exposed silicon surface of the solar cell will then go through, (1) a surface texturing process to create textures for effective light trapping; (2) a thin surface passivation and anti-reflection coating (ARC), to create a solar cell frontside (sunnyside) with textured and passivated and ARC coated silicon surface 152. The silicon wet etching cleaning and texturing process may be conducted in a single-side in-line process tool or in a batch immersion processing tool and the surface passivation and ARC layer coating may be performed in a PECVD tool by depositing a thin layer of silicon nitride to cover the textured silicon surface. As shown in FIG. 7C, the fabricated solar has no metal grids on its top surface, which is the sunny side of the solar cell.

Figure 8A:
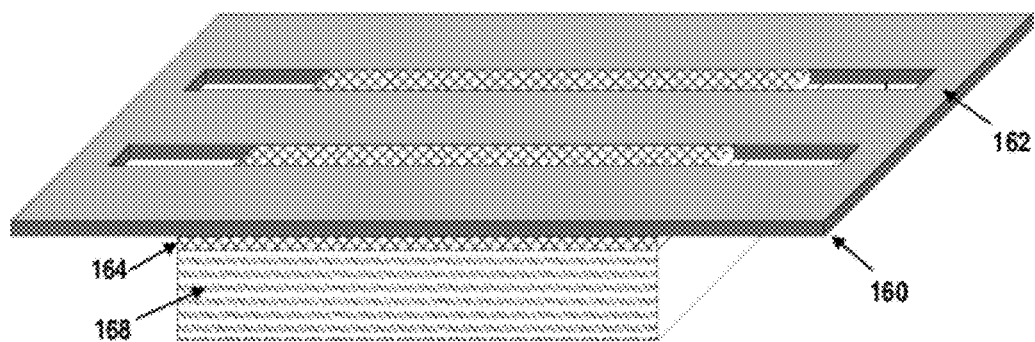
FIGS. 8A through 8C are diagrams of a solar cell, highlighting the backplane, after key fabrication process steps.
Figure 8B:
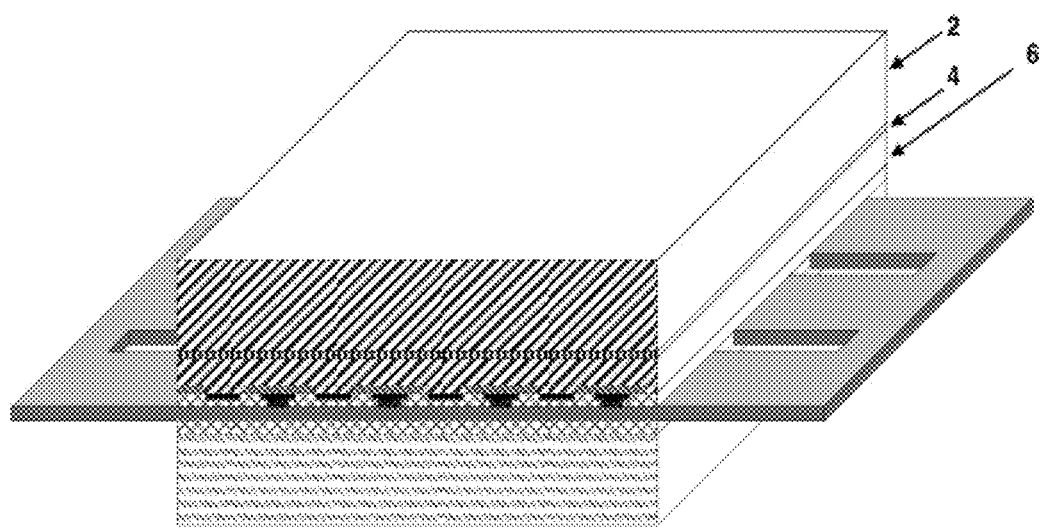
Figure 8C:
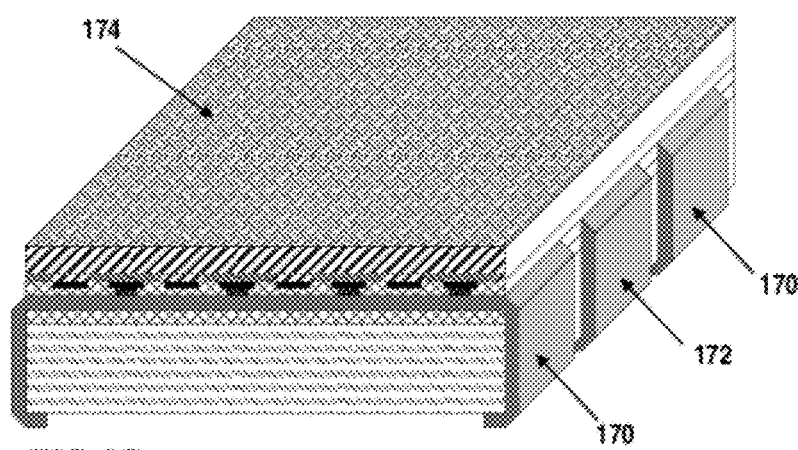

FIGS. 8A through 8C are diagrams of a solar cell and an alternative backplane, after key fabrication process steps. The structural features depicted in the cross sectional diagrams of FIGS. 8A through 8C are consistent unless otherwise noted.

FIGS. 8A-8C illustrate the schematic drawings of an alternative TFSS-based back-contact solar cell. FIG. 8A illustrates a section of a backplane comprising backplane 168 (also referred to as the backplane plate) bonded to patterned metal foil with edge extension 160 having metal edge crossbar 162 (to be trimmed in subsequent processing steps) by optional insulating adhesive 164. The solar cell structures and processes depicted in FIG. 8 are similar to the structures and processes in FIG. 7 except that the extended metal grids on the edge of the backplane are temporarily connected with crossbars. The metal electrodes on the backplane are orthogonally aligned and bonded to the metal electrodes on the solar cell.

FIG. 8B illustrates a section of the bonded backplane in FIG. 8A and the solar cell in FIG. 1A. FIG. 8C illustrates a section of a fabricated solar cell with bent emitter electrodes 170 and bent base electrodes 172 bent and wrapped-around the backplane edges. The frontside of the solar cell has been processed to form textured and passivated and ARC coated silicon surface 174. The metal edge cross-bars of the metal layer, shown as metal edge cross-bar 162 in FIG. 8A, are used to support the metal electrode edges during the metal layer lamination, patterning and edge-bending processes. The metal edge cross-bars may be trimmed off or scribed to separate adjacent electrodes after the mounting or edge bending and the processing of the cell may proceed similar to that as described in FIG. 7C.

FIGS. 9A through 9E illustrate the bonding of the backplane shown in FIG. 7A and solar cell assembly shown in FIG. 1A, in which case the metal electrodes on the backplane are orthogonally aligned and bonded to the metal electrodes on the solar cell, after key process steps from an alternative angle of the angle in FIGS. 7A through 7C. The structural features depicted in the cross sectional diagrams of FIGS. 9A through 9E are consistent unless otherwise noted.

Figure 9A:
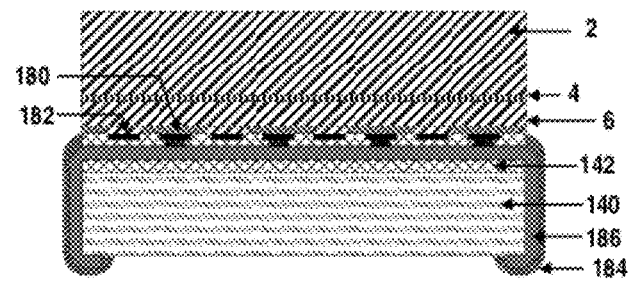
FIGS. 9A through 9E illustrate the bonding of the backplane shown in FIG. 7A and solar cell assembly shown in FIG. 1A.

FIG. 9A illustrates a cross-section of the bonded backplane shown in FIG. 7A and solar cell assembly shown in FIG. 1A. The solar cell with attached template is first placed on top of the backplane and the metal pattern on the backplane is orthogonally aligned to the metal pattern on the solar cell. The bonding is preferably performed in vacuum environment to eliminate air bubble trapping between the backplane and the solar cell and a controlled pressure is applied to during the bonding in order to make full surface contact. After the initial bonding, the assembly may be slightly heated by hotplate contact or an infrared lamp. As a result, the conductive posts will make full electrical contacts to the metal layers, shown as emitter contact 180 and base contact 182, and the melted and re-flowed adhesive dielectric layer will bond the two plates together. The orthogonal aligned bonding of the two metal layers provides a space transformation from relative small metal grid pitch on the solar cell to the large metal pitch on the backplane. Therefore, the backplane top cell alignment and attachment as well as interconnection of solar cells in a PV module assembly may be conducted more conveniently with relatively coarse alignment with large tolerance.

The edge-extending length of the metal ribbons is preferred to be a long enough to wrap around the backplane edge and provide space for making contacts either along the edge sidewalls or one the backside of the backplane. The edge-extending length of the metal ribbon is preferred to be in the range of 2 mm to 15 mm. The overhanging metal ribbons are then bent and wrapped-around the backplane edges, shown as metal wrap around 186 which may be either bent emitter electrodes 150 or bent base electrodes 152 from FIG. 7C.

Process-compatible insulating adhesives are used to bond the ribbon edges to the backplane edge surfaces and also cover the exposed the surfaces of the metal ribbons for enabling the subsequent wet and plasma processing steps, shown as 184 in FIG. 9A. Edge-sealing insulating adhesives may be applied by dispensing, dipping, or spraying coated, or by applying and laminating slivers of an encapsulant material to cover the wrap around metal foil. Examples of edge-sealing insulating adhesives include EVA, Z68, or PV silicone encapsulants. Protective coverage of exposed metal surfaces prevents the metal surface from exposure to the silicon wet etching and PECVD process in order to eliminate potential metal cross contaminations.

Figure 9B:
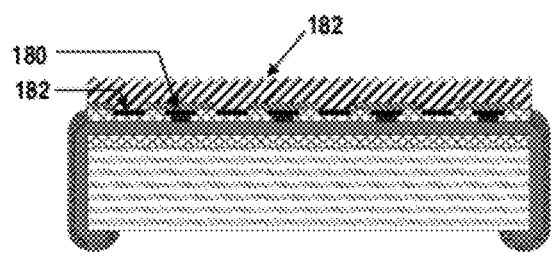

FIG. 9B illustrates a cross-sectional drawing of the backplane-supported solar cell after release from the reusable template release and top surface treatments. After the template release, porous silicon debris and quasi-monocrystalline silicon layer at the TFSS and template interfaces are cleaned and removed in controlled silicon etching process, such as diluted KOH or TMAH or HF+$HNO_3$ based silicon etching. The cleaned silicon template will be used again in the next cycle of forming porous silicon layers and growing epitaxial silicon layer. The exposed silicon top surface of the solar cell will then go through a surface texturing process to create textures, shown as textured solar cell surface 182, for effective light trapping and reduced optical reflection loses. The silicon wet etching cleaning and texturing process may be conducted in a single-side in-line process tool or in a batch immersion processing tool.

Figure 9C:
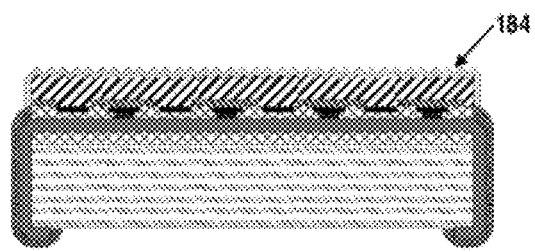

FIG. 9C illustrates a cross-sectional drawing of the backplane-supported solar cell after formation of thin surface passivation and anti-reflection coating (ARC) 184. The surface passivation and ARC layer may be formed in a PECVD tool by depositing a thin layer of silicon nitride to cover the textured silicon surface.

Figures 9D, 9E:
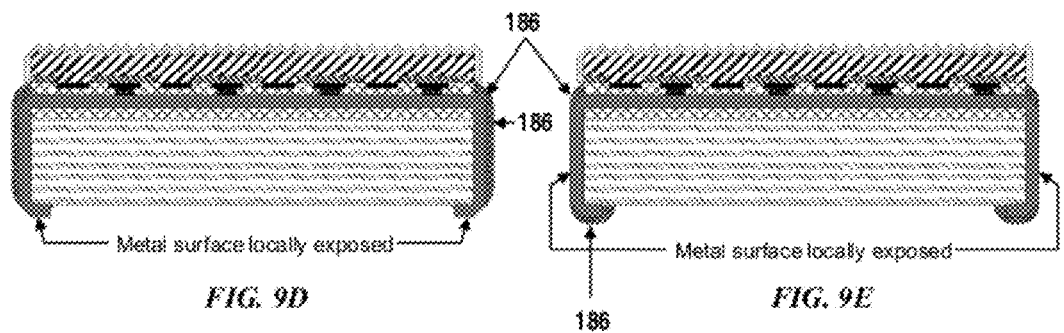

FIGS. 9D and 9E are alternative embodiments of the backplane-supported solar cell after selective removal of edge-sealing encapsulant adhesive 186. FIG. 9D illustrates a cross-sectional drawing of the backplane-supported solar cell after selective removal of edge-sealing encapsulant adhesive 186 from the bottom side of the backplane. The local removal of the edge-sealing insulating adhesive may be conducted by one of the following methods: (1) Abrasive tape lapping, by which the adhesive is removed locally and the metal surface is exposed; (2) Abrasive blasting, by choosing abrasive particles with proper hardness, shapes and dimensions, the focused blasting selectively removes the adhesive layer from the top surface layer of the metal layer; (3) Mechanical drilling/milling, by which the drill bit or the milling tip will remove the adhesive layer and partial of the metal layer to expose the metal surface; (4) Laser heating or ablation, by positioning and focusing the laser beam directly to the adhesive area to be removed, the laser beam energy will burn the adhesive and exposed the metal surface underneath. After the local removal of edge-sealing encapsulant adhesive 186, the solar cell may be cleaned by deionized water following the compressed air drying.

FIG. 9E illustrates a cross-sectional drawing of the backplane-supported solar cell after selective removal of edge-sealing encapsulant adhesive 186 from the sidewall of the backplane. The local removal of the edge-sealing insulating adhesive may be conducted by one of the following methods: (1) Abrasive tape lapping, by which the adhesive is removed locally and the metal surface is exposed; (2) Abrasive blasting, by choosing abrasive particles with proper hardness, shapes and dimensions, the focused blasting selectively removed the adhesive layer and top surface layer of the metal layer; (3) Mechanical drilling/milling, by which the drill bit or the milling tip will remove the adhesive layer and partial of the metal layer to expose the metal surface; (4) Laser heating or ablation, by positioning and focusing the laser beam directly to the adhesive area to be removed, the laser beam energy will burn the adhesive and exposed the metal surface underneath. After locally removing edge-sealing encapsulant adhesive 186, the solar cell may be cleaned by deionized water following the compressed air drying.

Figure 10A:
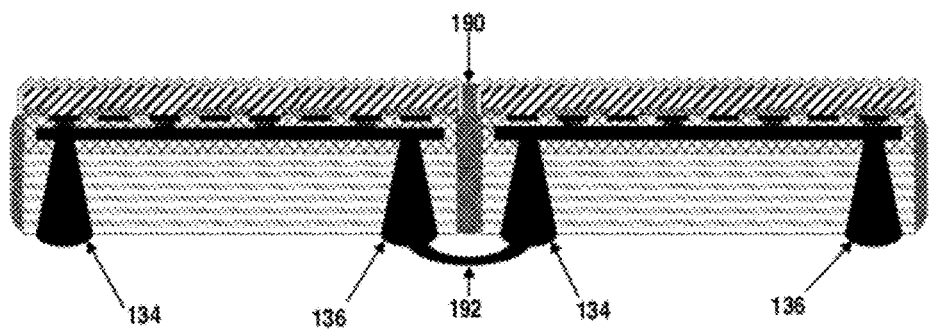
FIGS. 10A through 10C illustrate alternative embodiments of interconnected solar cells.
Figure 10B:
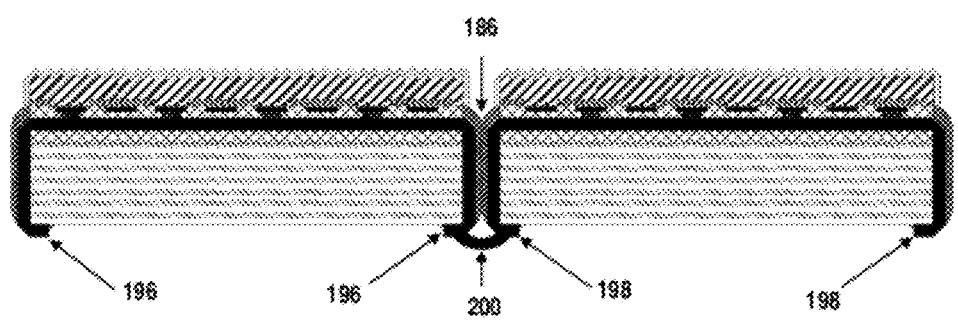
Figure 10C:
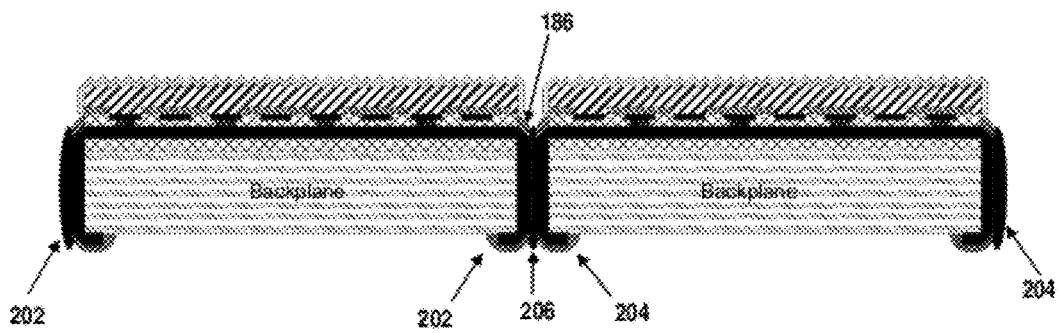

FIGS. 10A through 10C illustrate alternative embodiments of interconnecting solar cells in cases where the metal electrodes on the backplane are orthogonally aligned and bonded to the metal electrodes on the solar cell. The structural features depicted in the cross sectional diagrams of FIGS. 10A through 10E are consistent unless otherwise noted.

FIG. 10A illustrates the electrical interconnect of a solar cell matrix of the solar cell shown in FIG. 6E which has embedded and encapsulated electrodes and busbars. As shown, the two cells are interconnected in series, shown as electrical interconnect 192, by connecting the opposite polarity electrodes, base electrodes 134 and emitter electrodes 136. Electrical interconnect 192 may be a soldered, welded, or wire-bonded interconnect, formed for example by soldering segments of Sn-coated Cu ribbons at backplane vias. The number of interconnect metal segments and vias between two connected cells may be in the range of 10 to 100. Edge insulating adhesive and encapsulant 190 helps to protect and bond each solar cell.

FIG. 10B illustrates the electrical interconnect of a solar cell matrix by using solar cells such as those shown in FIG. 5B, 7C or 8C which have wrapped-around emitter and base electrodes. In this case, also is as shown in FIG. 9D, the exposed metal surface for electrical interconnects, exposed from edge insulating adhesive and encapsulant 186, is positioned at the backside of the backplane and close to the backplane edges. The two cells are interconnected in series, as shown by electrical interconnect 200, by connecting the opposite polarity electrodes of the two adjacent cells, shown as base electrode 196 and emitter electrode 198. Electrical interconnect 200 may be a soldered, welded, or wire-bonded interconnect, or alternatively formed by dispensing and drying conductive epoxy at proper backplane sidewall locations to connect the base electrodes of one cell to the corresponding emitter electrodes of the adjacent cell. Alternatively, the connection may be made by soldering segments of Sn-coated Cu ribbon between the base electrodes of one cell to the emitter electrodes of the adjacent cell. The number of metal connection may be between two connected cells is in the range of 10 to 100. Alternatively, the adjacent cells may be interconnected using a module backsheet and monolithic module assembly methods.

FIG. 10C illustrates an electrical interconnect embodiment of a solar cell matrix by using solar cells shown in FIG. 5B, 7C or 8C which have wrapped-around emitter and base electrodes. In this case, also as shown in FIG. 9E, the exposed metal surface for electrical interconnects, exposed from edge insulating adhesive and encapsulant 186, are at the sidewalls of the backplane. The two cells are interconnected in series, by electrical interconnect 206, by connecting the opposite polarity electrodes, shown as base electrode 202 and emitter electrode 204. Electrical interconnect 206 may be a soldered, welded, or wire-bonded interconnect, or alternatively formed by dispensing and drying conductive epoxy at proper backplane sidewall locations to connect the base electrodes of one cell to the corresponding emitter electrode of the adjacent cell. The number of metal connection between two connected cells is in the range of 10 to 100.

Figure 11:
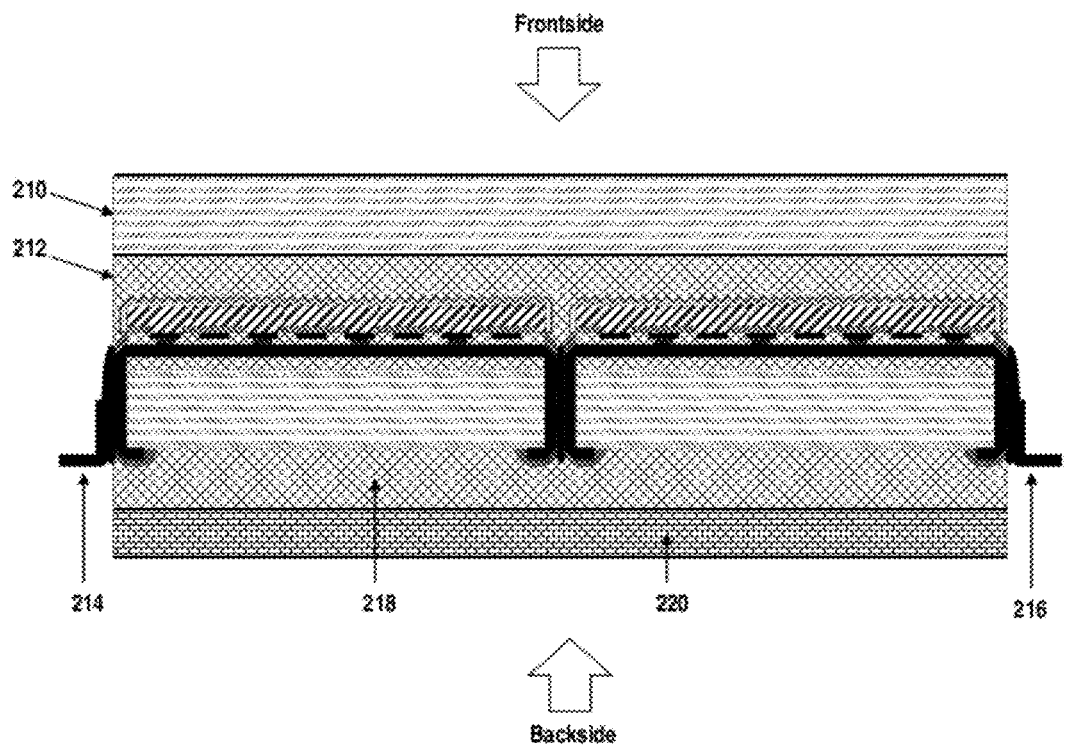
FIG. 11 illustrates a cross-sectional drawing of a solar cell module.

FIG. 11 illustrates a cross-sectional drawing of a solar cell module using two cells connected in series to partially represent a cell matrix, which may have 36 series-connected cells. The solar cells depicted in FIG. 11 are the same as those from FIG. 10C and as such the structural features depicted in the cross sectional diagrams of FIGS. 10C and 11 are consistent unless otherwise noted. As depicted, base electrode 214 of the left cell is electrically connected to emitter electrode 216 of the right cell. The interconnect cell matrix that the two cells represent is sandwiched between two layers of EVA encapsulant, top EVA encapsulant layer 212 and bottom EVA encapsulant layer 218. The EVA sheets are laminated and then covered by a thick low-iron soda lime glass of 2 mm to 3 mm thickness at the module front side, shown as glass cover 210, and a composite plastic sheet at the module back side, shown as back sheet 220.

FIGS. 12A through 12D illustrate an apparatus and fabrication process of making strips of metal electrode from a thin metal foil that is laminated on a backplane with insulating adhesives. Generally, this tool consists of a group of aligned sharp blades that can freely rotate during slitting, adjustable pressure and position control unit, and a temperature controlled heating or cooling chuck for setting the proper temperature of the bonding material for the metal slitting. In other words, the bonding material between the metal foil and the backplane may be maintained at temperatures colder than room temperature to increase material hardness during metal slitting and raised to higher than room temperature for melting and reflowing the insulating adhesive encapsulant material in order to fill the slit metal gaps. The structural features depicted in the cross sectional diagrams of FIGS. 12A through 12D are consistent unless otherwise noted.

Figure 12A:
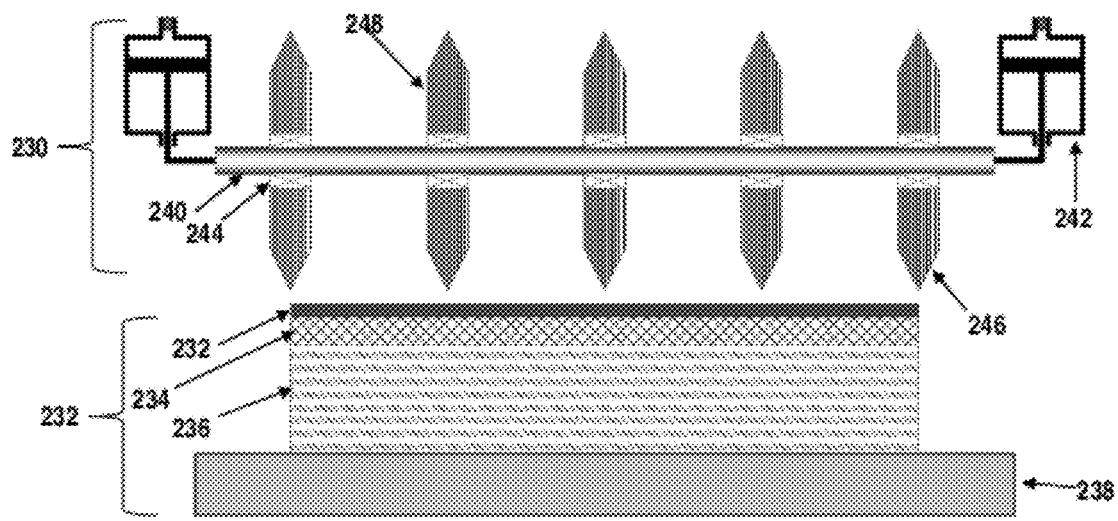
FIGS. 12A through 12D illustrate an apparatus and fabrication process of making strips of metal electrodes.

FIG. 12A illustrates metal foil slitting apparatus 230 used to slit a laminated metal foil into interconnected strips or ribbons on backplane fabrication setup 232. Metal foil 232, such as an aluminum foil 25 µm to 150 µm thick, is laminated on top of backplane plate 236 through a sandwiched layer of insulating adhesive 234 (for example, in the range of 200 µm to 500 µm thick). The backplane plate may be a sheet of glass or plastic in the range of 0.2 mm to 3 mm thick. Examples of the insulating adhesive encapsulant layer include Z68, EVA or PV silicone. Temperature controlled vacuum chuck 238 (−20° C. to 150° C.) positions metal foil 232 below slitting apparatus 230 comprising an aligned array of circular slitting blades 248 with sharp tapered edges 246. The slitting blades are attached to lateral shaft 240 through precision bearings 244 so that the blades may freely rotate when the shaft undergoes lateral movement parallel to the plane of the metal foil—utilizing this configuration there is no lateral motion at the blade and foil contacts when the blades press down on the metal foil for slitting. As a result, at any slitting location and moment, the metal foil is locally deformed and then torn open when the local foil vertical deformation reaches a critical depth. As the shaft moves, the tearing fronts of the metal foil follow, therefore metal ribbons with narrow separation gaps are formed on the backplane. The local deformation of the metal foil at the opening areas is made permanent by the tapered blade edge so that the two adjacent metal ribbons do not make contact after slitting.

In one aspect of effectively achieving this controlled metal foil slitting, the slitting apparatus may comprise the following embodiments: (1) The slitting force, pressure, and the metal foil vertical deformation depth have to be precisely controlled. As shown in FIG. 12A, the shaft assembly is mechanically connected to slitting pressure and depth control unites 242 with compressed fluid with controllable pressure that determines the blade slitting pressure. Both shown pressure chambers are connected to a common pressure source so that during the slitting the shaft lateral motion is self-aligned and parallel to the backplane lateral surface. The pneumatic controlled pressure may be set so that the vertical motion of the blades could be stopped when they reach the backplane surface. (2) The hardness of the underneath insulating adhesive may also be actively controlled for effective metal foil slitting. For example, in the case that the underneath insulating adhesive layer is soft, the metal foil could not be torn open by the slitting blades even when it reaches the maximum local deformation and makes contact to the backplane top surface. Therefore the insulating adhesive material is preferably hard and rigid. Generally, the lower the temperature an insulating material is the harder it is. Thus the vacuum chuck that hold the backplane is preferably chilled to a lower than ambient temperature, such as below 0° C., in order to facilitate the metal foil slitting with a certain slitting pressure and lateral speed. In addition, another consideration is that at a low temperature, the metal foil may fracture easier than at room temperature; therefore, a low slitting temperature is more beneficial. In an alternative method, the metal foil with the attached insulating adhesive and backplane may be chilled to a low temperature prior to the slitting and perform the slitting process timely after the backplane is vacuum chucked so that the materials are still at required low slitting temperature. (3) The slitting blades have a particularly designed tapered shoulder that is used to permanently bend the edges of the metal ribbons in a self-aligned manner. Due to edge bending, the gaps between the adjacent metal ribbons are created wider than if simply torn open by the sharp blade edge.

The metal foil slitting method of the present disclosure provides following advantages: First, because there is no relative motion in the lateral directions between the blade slitting front and metal foil the metal foil is torn open. Thus, there is no cutting metal debris generated from this metal slitting process and a decreased possibility of electrical shorting caused by the metal debris. Second, since the metal ribbons are formed by local cutting and tearing, there is no metal foil material loss from this slitting process. And as a result, the full surface area and the full volume of the original metal foil is used for extracting and conducting the electrical current.

Figure 12B:
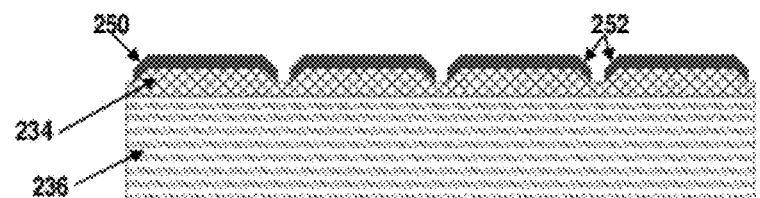

FIG. 12B illustrates slit metal ribbon 250 with edge-deformation, shown at reference numeral 252, on top of insulating adhesive 234 and backplane plate 236. The width of the gap cut into the adhesive layer between two adjacent metal ribbons is preferably in the range of 50 µm to 0.5 mm, and the depth is preferably in the range of 100 µm into the adhesive layer up to going through the full thickness of the adhesive layer. The edges of the metal ribbons, as shown by the edge-deformation at reference numeral 252, are bent and further separated from each other by the tapered blade shoulder design, 246 in FIG. 12A, of the present disclosure.

Figure 12C:
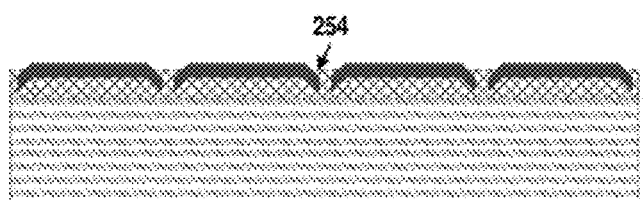

FIG. 12C illustrates the backplane metal ribbons after a melting and reflowing adhesive process. In this step, the insulating adhesive under the metal ribbons, insulating adhesive 234, is heated by, for example, either an underneath hot chuck or an infrared lamp. Upon melting, the insulating adhesive flow through and fill the gaps between the adjacent metal ribbons, as shown at reference numeral 254. And as a result, the edges of the metal ribbons are also covered by the reflowed insulating encapsulant adhesive layer.

Figure 12D:
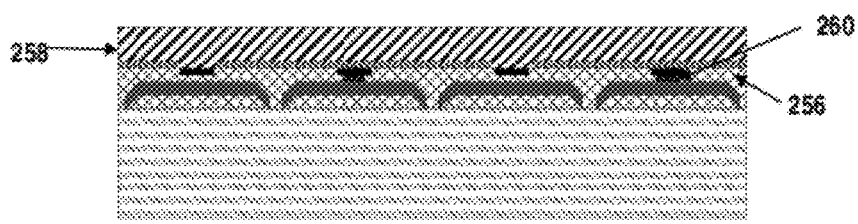

FIG. 12D illustrates the interconnecting metal ribbons and insulating adhesive structural after the bonding of the backplane assembly and solar cell 258 through conductive adhesive posts 260. During the bonding process, the insulating encapsulant adhesive may be again heated, for example by a hot chuck or an infrared lamp, so that it melts and reflows yet again, shown as reflowed insulating adhesive 256. During this reflow, the melted adhesive is pulled above the metal ribbons so that it also isolates the top surface of the metal ribbons from the metal surfaces on the solar cell except for the conductive adhesive post areas. To facilitate this second adhesive reflow, the bonding between the backplane assembly and the solar cell is preferably performed in a vacuum chamber so that capillary forces will contribute to the up and lateral pulling of the insulating adhesive layer. Or alternatively, another insulating adhesive spacer layer may be applied to the solar cell surfaces except for the conductive adhesive post areas by, for example, deposition by screen-printing, inkjet-printing or position, or volume controlled dispensing.

Figure 13A:
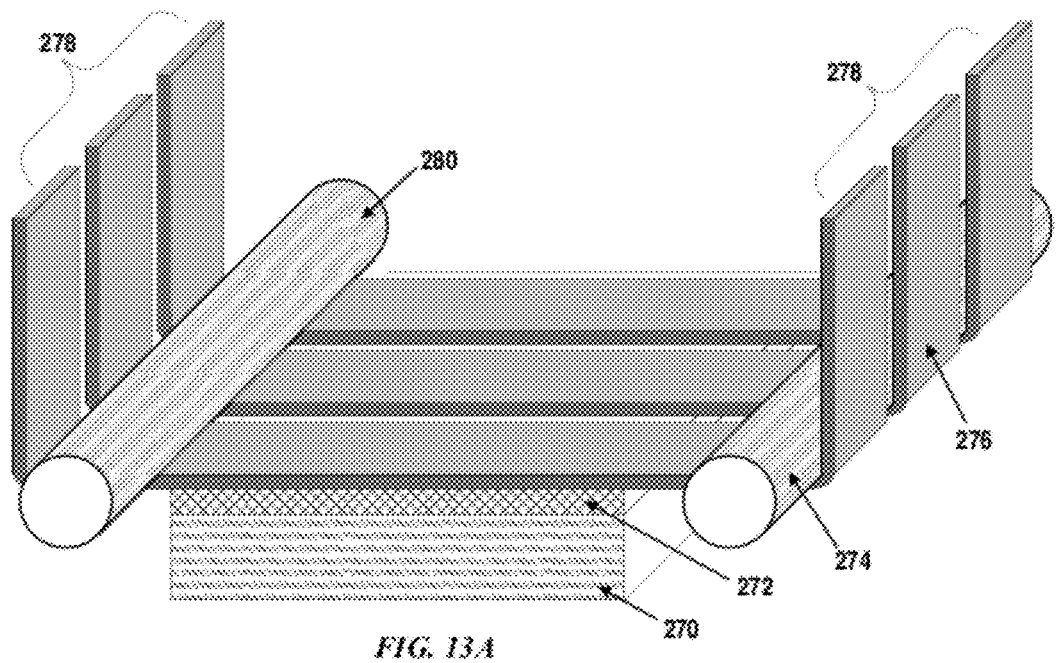
FIGS. 13A and 13B illustrate an apparatus and method for laminating pre-fabricated metal ribbons on a backplane.
Figure 13B:
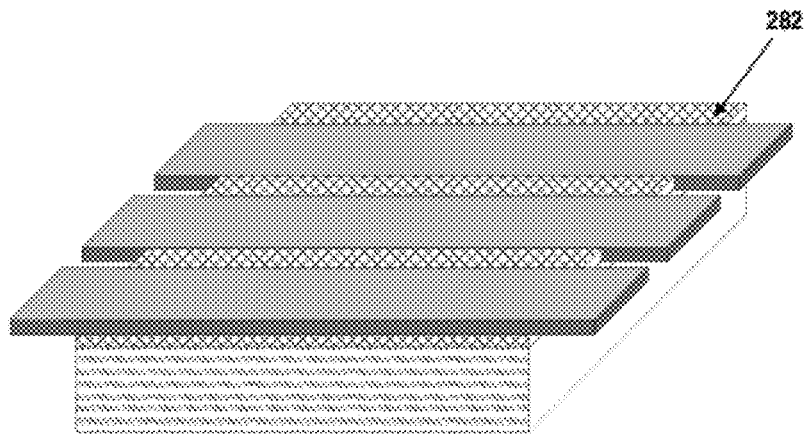

FIGS. 13A and 13B illustrate an apparatus and method for laminating pre-fabricated metal ribbons on the backplane with insulating adhesives. This laminating tool may consist of jigs for metal strip spacing alignment, tension control, and temperature controlled heating chuck for melting and reflowing the insulating adhesive encapsulant material. The structural features depicted in the cross sectional diagrams of FIGS. 13A and 13B are consistent unless otherwise noted.

FIG. 13A illustrates a schematic drawing of the laminating apparatus in operation on backplane plate 270 and insulating adhesive 272 (for example, a PV-grade encapsulant such as EVA of Z68). Metal ribbons 276 (for example, Al or Al alloy) are prefabricated by slitting and rewinding machines and the metal ribbon rolls are properly spaced by placing precise spacers between the adjacent rolls to form metal ribbon roll sheet 278. For example, the metal ribbons may have widths in the range of 2 mm to 15 mm, a thickness in the range of 0.1 mm to 0.5 mm, and a lateral gap in the range of 0.5 mm to 2 mm. Lateral tension is applied to the metal ribbons during the lamination process by tension control rollers 274 and 280 to ensure the metal ribbons are be fully stretched. Tension control rollers 274 and 280 may be spring-loaded or pneumatic cylinder connected for pressure controlled and displacement and position controlled by connected actuators and proximity sensors. A more coarse alignment to the backplane edges is also needed so the ribbons will be positioned in the orthogonal direction to the metal electrodes on the solar cell when bonded.

In the next step, metal ribbons 276 are heated by an infrared lamp briefly so that underneath insulating adhesive 272 may be melted and reflowed to fill in the space between adjacent metal ribbons, shown as reflowed insulating adhesive 282 in FIG. 13B. After reflowed adhesive 282 is cooled to the ambient temperature and the metal ribbons are securely mounted on the backplane, the overhanging portions of the metal ribbons are cut by, for example, laser trimming, mechanical punching, cutting or slitting.

FIG. 13B illustrates the bonded metal ribbon segments after they have been cut from metal ribbon roll sheet 278. As shown, the metal ribbons extend out from the edges of the backplane to enable electrode wrap-around electrical interconnections, as described and shown in FIG. 7A. Thus, the overhanging length of the metal ribbons should be cut long enough so that the overhang may be wrapped around the backplane edges in further processing.

Figure 14A:
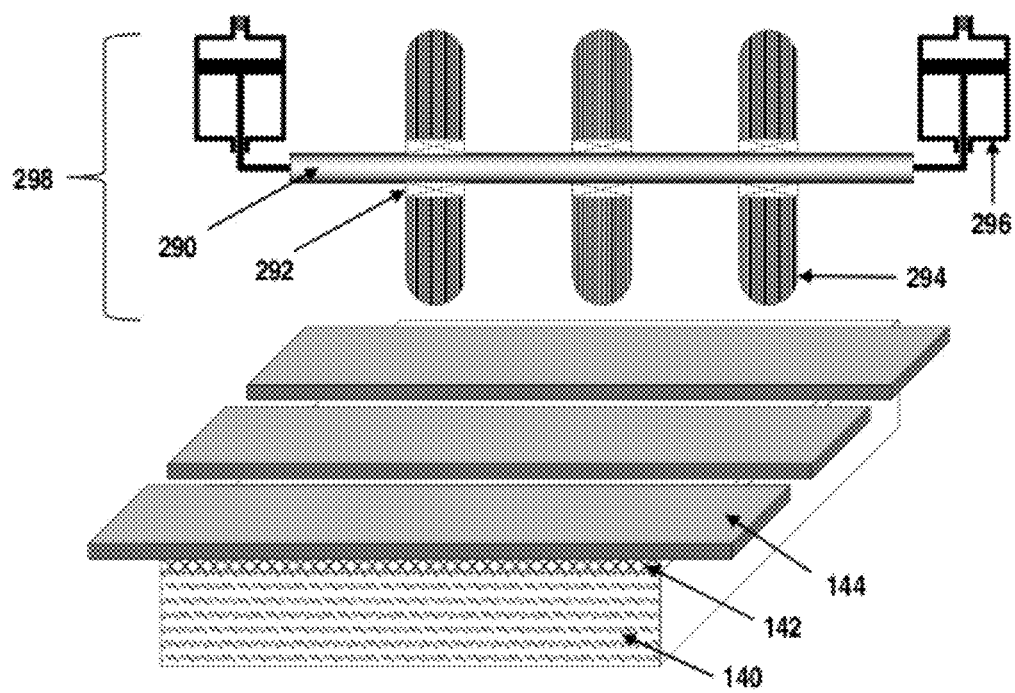
FIGS. 14A through 14C illustrate an apparatus and fabrication process for making metal electrodes with deformed regions.
Figure 14B:
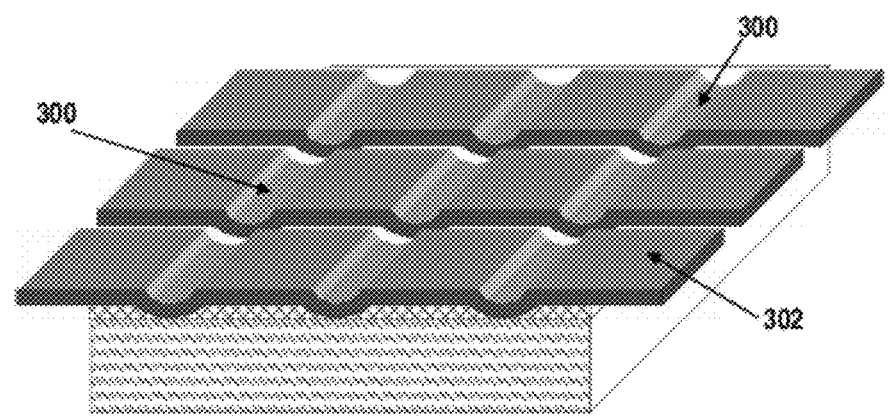
Figure 14C:
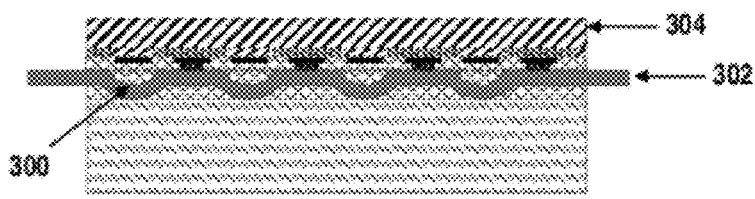

FIGS. 14A through 14C illustrate an apparatus and fabrication process for making metal electrodes with deformed regions for the directional releasing of the out-of-plane stress of the metal electrodes that is generated from material thermal mismatches. Generally, this metal forming apparatus may form orthogonal micro groove or wave-shaped patterns on the laminated metal ribbons for directional controlled stress reduction and to which may act as direct metal-to-metal contacts between the metal ribbons and thin metal layers on the silicon solar cells. Further, the backplane structure depicted in FIG. 14A is similar to the backplane structure depicted in FIG. 7A. The structural features depicted in the cross sectional diagrams of FIGS. 14A through 14C and FIG. 7A through 7C are consistent unless otherwise noted.

In the backplane bonded solar cells depicted in earlier figures, the metal ribbons that are sandwiched between the insulating adhesive layers are flat and make electrical contact to the metal layer of the solar cell through conductive adhesive posts. Often, as the bonded solar cells go through coating, lamination, and packaging processes, higher than room-temperature process may be used. And solar modules themselves often go through temperature variations while in actual use. Because the metal ribbons have a different thermal expansion coefficient than the insulating adhesive, conductive adhesives, silicon, and glass, mechanical stress may sometimes build up in the metal foil when undergoing temperature changes. When the stress increases above a critical value, the flat metal ribbons may undergo out-of-plane buckling and deformation. This stress induced metal ribbon deformation may cause the separation of electrical connections to the conductive adhesive post areas and may also cause shorting to opposite electrodes with upward ribbon deformation. To overcome these potential problems, the present disclosure provides methods and apparatus to make arrayed local deformations on the metal foil. The locally formed deformations are deformed toward the backplane. When the metal ribbons are under stress, they will buckle only in the downward direction and toward to the backplane (away from the bonded solar cell and metal contacts).

FIG. 14A illustrates metal foil forming apparatus 298 used to form groove-shape permanent deformations on the metal ribbons on the backplane design illustrated in FIG. 7A comprising backplane plate 140 bonded to interdigitated metal ribbons with edge extensions 144 by optional insulating adhesive 142. Metal ribbons 144, such an aluminum ribbons of 25 μm to 200 μm thick, may be laminated on top of a backplane through a sandwiched layer of insulating adhesive 142 200 μm to 500 μm thick. The backplane plate may be a sheet of glass or plastics of 0.2 mm to 3 mm thick. Examples of the insulating adhesive layer include Z68, EVA or PV silicone. In addition to known methods, methods for making and bonding the metal ribbons are described in FIGS. 12 and 13.

Metal ribbon forming apparatus 298 comprises an aligned array of circular forming wheels 294 having convex profiles. Forming wheels 294 are attached to lateral shaft 290 through precision bearings 292 so that the wheels may freely rotate when the shaft undergoes lateral movement parallel to the plane of the metal foil. Lateral shaft 290 is positioned in the parallel direction of the ribbons and the lateral forming motion of the shaft is in the direction perpendicular to the metal ribbons. Using this configuration, when the forming wheels press down the metal ribbons there is no lateral motion at the wheel and ribbon contacts. As a result, at any forming location and any moment, the metal ribbons are locally deformed and permanently deformed when the deformation reaches a critical depth. As lateral shaft 290 moves, the forming front of the metal ribbons follow and thus metal ribbons with groove-shape deformations are formed on the backplane.

To help effectively achieve controlled metal ribbon deformation, the metal ribbon forming apparatus may comprise the following embodiments: (1) The forming force, pressure, and the metal foil vertical deformation depth have to be precisely controlled, and as shown in FIG. 14A, the shaft assembly is mechanically connected to forming pressure and depth control unit 296 with compressed fluid under controllable pressure that may determine the forming wheel pressure. Both the left and right forming pressure and depth control units are connected to a common pressure source; therefore, during the forming the shaft's lateral motion is self-aligned and parallel to the backplane lateral surface. The pneumatic controlled pressure may be set so that the vertical motion of the forming wheels can be stopped when the wheels reach the backplane surface. (2) The hardness of the underneath insulating adhesive may be actively controlled for effective metal foil slitting. For example, if the underneath insulating adhesive layer is hard then the metal ribbons may be hard to deform. Therefore, for improved forming performance, the insulating adhesive material is preferably soft. Given a chosen insulating adhesive material, the higher the temperature it is the softer it is. Thus the vacuum chuck that hold the backplane is preferably heated to a higher than ambient temperature, such as below 100° C., in order to facilitate the metal ribbon forming with a certain forming pressure and lateral speed. In an alternative method, the metal ribbons with the attached insulating adhesive and backplane may be heated by an IR lamp or they may be pre-heated to a high temperature prior to the forming and the forming process performed right after the backplane is vacuum chucked so that the materials are still at a required high forming temperature. (3) The form wheels may be designed and machined to have various profiles to form metal ribbon deformation shapes with optimized stress reduction and direction performance.

FIG. 14B illustrates metal ribbons 302 after forming the orthogonal out-of-plane (wave-form) grooves 300. Importantly, because the maximum local deformation of the metal ribbons is equal to the insulating adhesive thickness, which is in less than 0.5 mm, the overall ribbon length reduction after the forming is minimal.

FIG. 14C illustrates a backplane bonded to solar cell 304 with formed metal ribbons that have vertical out-of-plane wave-form deformations. At high process and operation temperatures and during certain temperature changes, the stress releasing deformation of the metal ribbons will follow the deformation pre-formed profile—toward to the backplane. At the same time, the metal ribbon areas that make contact through the conductive adhesive posts (or any other known solar cell contact design) will experience an upward local pressure due to the wave-pattern of the pre-formed the metal ribbon shape. As a result, the contacts will experience a compressive load from the metal ribbons when the temperature goes up. Thus electrical contact failure is avoided when temperature changes. As an additional advantage, the formed grooves work as loaded springs when the solar cell is mounted for achieving more reliable electrical contacts.

Figure 15A:
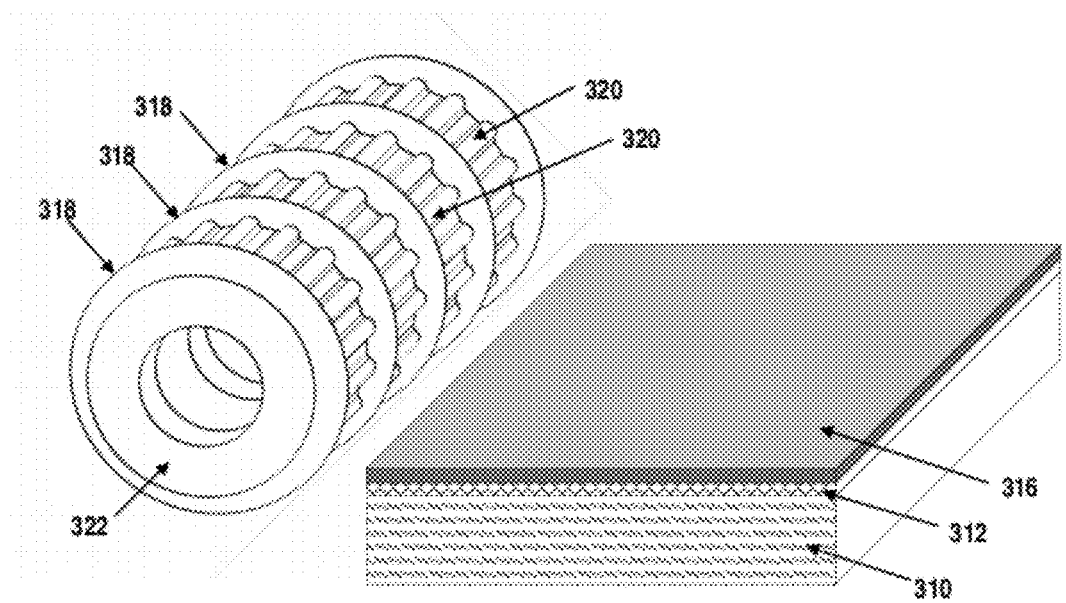
FIGS. 15A through 15C illustrate an apparatus and fabrication process for making metal electrodes with alternating deformed regions.
Figure 15B:
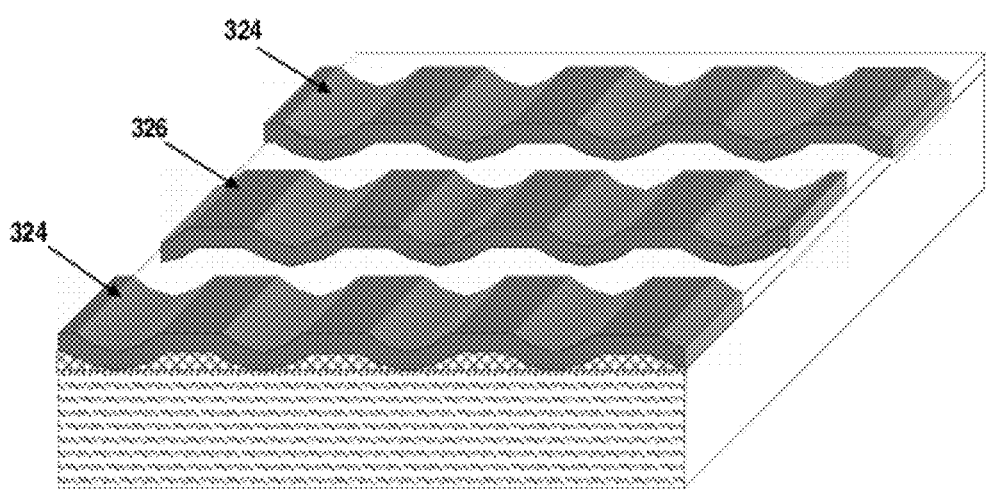
Figure 15C:
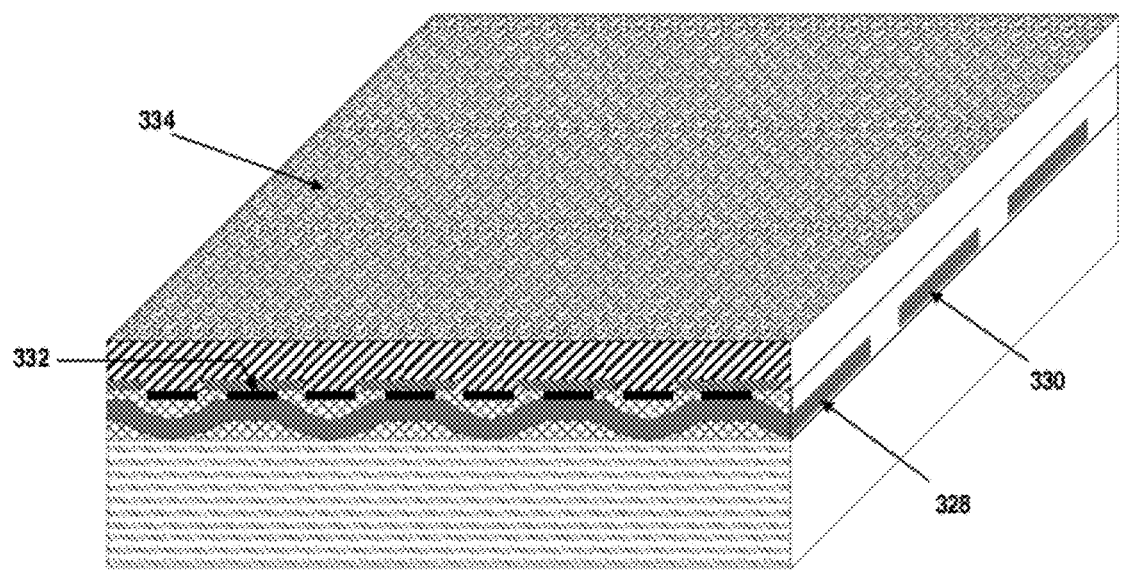

FIGS. 15A through 15C illustrate an apparatus and fabrication process for making metal electrodes with alternating deformed (described as bent curved or wave form although other deformation shapes are possible depending on the shape of the forming wheels) regions for direct metal-to-metal bonding from the backplane assembly to the solar cell. The apparatus, a roller with integrated slitting blades and forming wheel, is used for both the self-aligned slitting and forming process. The structural features depicted in the cross sectional diagrams of FIGS. 15A through 15C are consistent unless otherwise noted.

FIG. 15A illustrates an apparatus that may be used to make deformed ribbon electrodes from a laminated metal foil by integrating both slitting blades and forming wheels into the same roller, integrated roller 322. Metal foil 316, for example an aluminum foil of 25 μm to 200 μm thick, is laminated on top of backplane 310 through a sandwiched layer of insulating adhesive 312. The backplane may be a sheet of glass or plastics with a thickness in the range of 0.2 mm to 3 mm. Examples of the insulating adhesive layer include Z68, EVA or PV silicone with a thickness in the range of 200 μm to 500 μm thick. The integrated roller comprises alternating slitting blades 318 and forming wheels 320 to form the emitter and base electrodes in a single step.

The adjacent emitter and base wheels have wave-patterns that are 90° phase-shifted to enable self-aligned electrical interconnects. The roller is attached to a lateral shaft (not shown) through precision bearings so that the roller may freely rotate when the shaft undergoes lateral movement that is parallel to the plane of the metal foil. Using this configuration, when the roller presses down on the metal foil for slitting there is no lateral motion at the roller surface and foil contacts. As a result, at any slitting location and moment the metal foil is locally deformed and then torn open when the local foil vertical deformation reaches a critical depth. At the same time, under the forming wheels the slit metal ribbons are deformed. As the shaft moves, the tearing fronts of the metal foil follow and metal ribbons with narrow separation gaps are formed on the backplane. The local deformation of the metal foil at the opening areas is made permanent by the tapered blade edge so that the two adjacent metal ribbons do not make contact after slitting. To effectively achieve controlled metal foil slitting and forming, the apparatus may comprise of the following embodiments: (1) The slitting and forming force, pressure, and the metal foil vertical deformation depth have to be precisely controlled so the shaft assembly is mechanically connected to a compressed fluid with controllable pressure that may determines the roller slitting and forming pressure. During slitting the shaft lateral motion is self-aligned and parallel to the backplane lateral surface. The pneumatic controlled pressure may be set so that the vertical motion of the roller surfaces could be stopped when they reach the backplane surface. (2) The hardness of the underneath insulating adhesive may be actively temperature controlled to optimized metal foil slitting and forming conditions. As described previously, a hard adhesive material underneath is favorable for slitting and a soft adhesive material underneath is favorable for forming. Given a particular adhesive material with a particular thickness, pressure parameters (such as temperature, roller pressure and speed) and roller surface profiles may be designed and optimized.

FIG. 15B illustrates the metal ribbons after slitting and forming. Since the maximum local deformation of the metal ribbons is equal to the insulating adhesive thickness, which is in less than 0.5 mm, the overall ribbon length reduction after the slitting and forming is minimal. As shown, the wave-shaped emitter electrodes 324 and base electrodes 326 are 90° phase-shifted so that when they are orthogonally bonded to the thin metal electrodes on the solar cell the peaks of the base wave electrodes only make contact to the thin base electrodes on the solar cell and the peaks of the emitter wave electrodes only make contacts to the thin emitter electrodes on the solar cell—an efficient self-aligned process. After the slitting and forming, the backplane is heated to melt and reflow the insulating adhesive so the reflow adhesive will fill the gaps between adjacent ribbon electrodes.

FIG. 15C illustrates a backplane bonded solar cell with formed metal ribbons. With this phase-shifted wave-shaped emitter electrode, 328, and base electrode, 330, structural design the metal ribbon surfaces to be contacted backplane are self-raised and the crimped metal ribbons exert spring loaded force to the solar cell contact points, such as solar cell emitter electrode 332 on solar cell 334, when the backplane assembly and the solar cell are bonded. Therefore, this 3-dimensional metal ribbon design provides the opportunity for direct metal-to-metal contacting and bonding without the need of conductive adhesive post materials and processes.

Figure 16A:
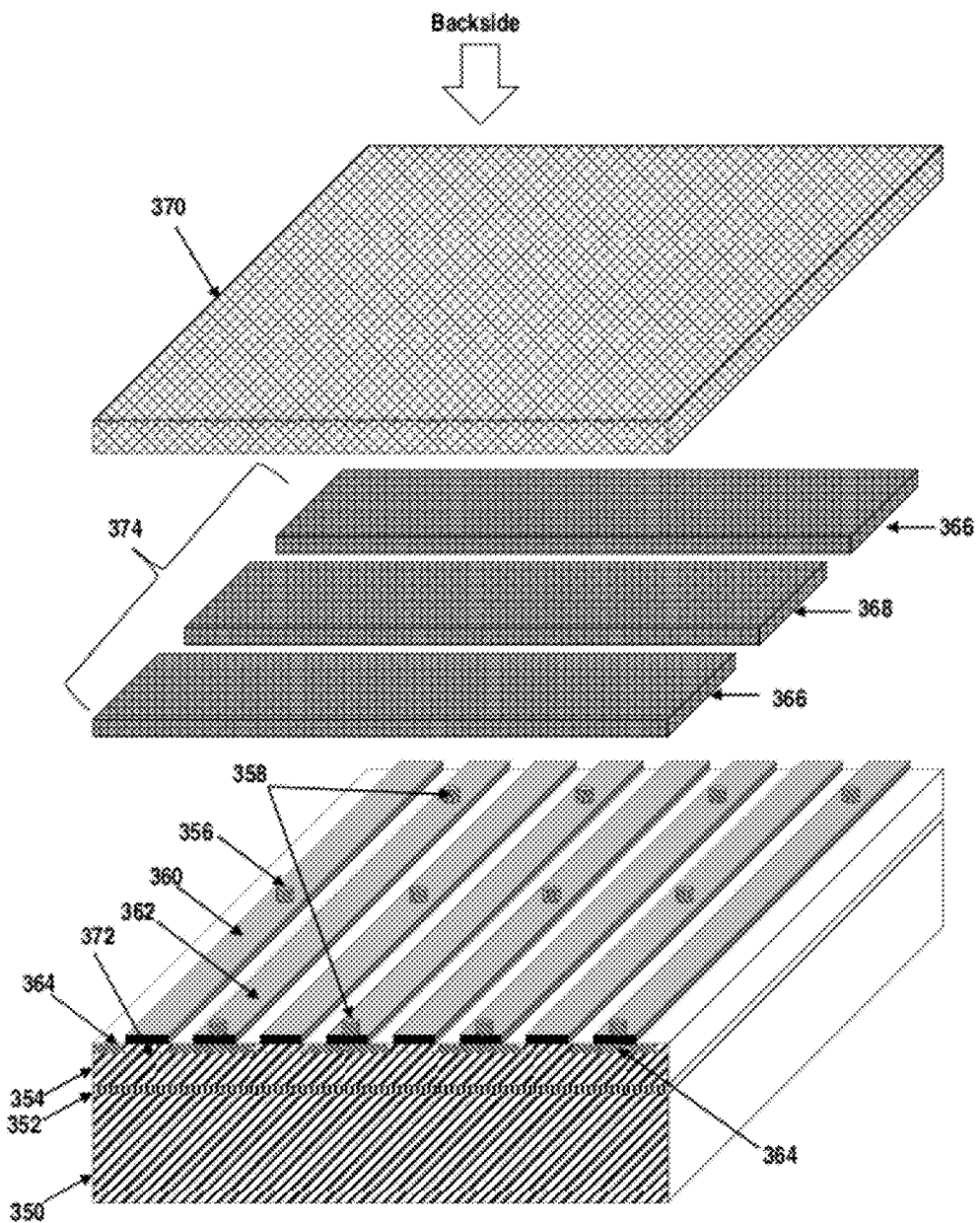
FIGS. 16A and 16B illustrate yet another alternative solar cell and supporting backplane design in accordance with the disclosed subject matter.
Figure 16B:
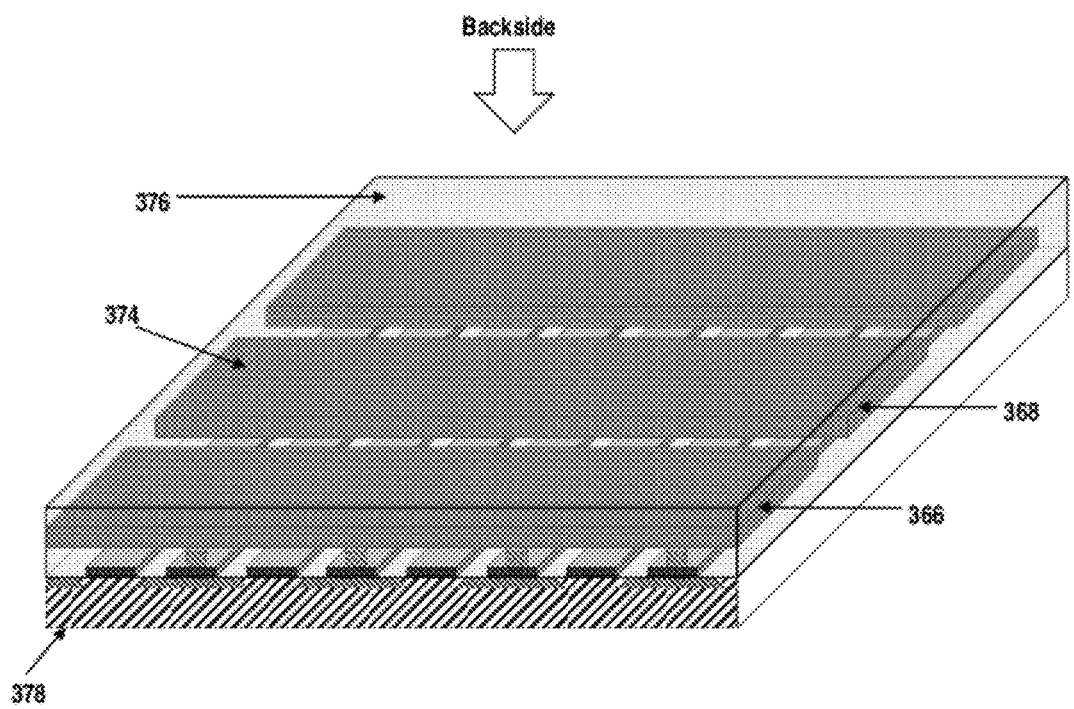

FIGS. 16A and 16B illustrate an alternative solar cell and supporting backplane design in accordance with the present disclosure. The structural features depicted in the cross sectional diagrams of FIGS. 16A and 16B are consistent unless otherwise noted. In this backplane design, the combination of thick metal electrodes and a thick dielectric encapsulant layer form the backplane of the solar cell.

FIG. 16A illustrates a solar cell design substantially consistent with the solar cell design in FIG. 1A without a dielectric adhesive layer on the solar cell shown. Thus, the manufacturing processes and material embodiments disclosed throughout the application and in particular in FIG. 1A and corresponding descriptive text. Epitaxially-grown thin-film silicon solar cell substrate 354 is attached to reusable silicon template 350 through porous silicon layer 354. Doped emitter contact regions 364, base contact regions 372, and the interdigitated thin metal electrodes (emitter metal electrodes 362 and base metal electrodes 360) are positioned on the backside of the solar cell (shown in FIG. 16A as the topside of the solar cell). Conductive adhesive posts, emitter conductive adhesive posts 358 and base conductive emitter posts 356, may be screen-printed or inkjet-printed on top of the thin metal electrode surfaces for electrically joining to thick metal electrode layer 374 comprising thick base metal electrodes 386 and thick emitter metal electrodes 366. The thick metal electrodes, 366 and 368, are in parallel ribbon shapes that are orthogonal to the thin metal electrodes, 360 and 362, on the silicon substrate surface. The thick metal electrodes are preferably made from an aluminum or aluminum alloy plate with a thickness in the range of 0.1 mm to 1 mm. The thick metal electrode ribbons may be laterally connected at their ends prior to the bonding with the lateral connections separated by laser ablation or mechanical milling after the bonding with the solar cell. Thick layer of dielectric encapsulant 370, such as EVA or Z68, is shown on top of the thick metal layer of thick base metal electrodes 386 and thick emitter metal electrodes 366.

FIG. 16B illustrates an epitaxially-grown thin-film silicon solar cell where thin film silicon substrate 378 has been release from template 350 and is mechanically reinforced by the bonded thick metal electrode layer 374 and the reflowed dielectric encapsulant layer 376. The thick metal electrodes are first placed on the conductive adhesive posts with an orthogonal alignment to the thin metal electrodes. Dielectric encapsulant layer 370 is then laminated on the backside of the cell in a vacuum laminator. During lamination, the encapsulant is heated, melted and reflowed to fully fill the gaps between the thick and thin metal electrodes. The reusable silicon template is then released from the assembly followed by the solar cell silicon surface cleaning, texturing, passivation and anti-reflection layer coating—which may be performed according to a process similar to the one described in FIG. 3. To make cell interconnections for the solar module assembly process, the dielectric encapsulant layer on top of the thick metal electrodes may be locally opened by the methods including laser drilling, mechanical drilling, and abrasive blasting—which may be performed according to a process similar to the one described in FIG. 3.

In operation, the disclosed subject matter provides methods, designs, and apparatus of making a mechanical supporting backplane structure with bonded relatively thick high-conductivity metal interconnects for extracting cell current, thus, enabling fabrication and final module packaging of thin back-contact solar cells. Further, the backplane embodiments of this disclosure may be used in conjunction with solar cells with semiconductor substrate thicknesses of less than 1 µm to more than 100 µm. More typically, the solar cell substrates may be several µm up to about 50 µm thick.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A back contact crystalline semiconductor solar cell, comprising:
    a crystalline semiconductor substrate, said substrate comprising a light capturing frontside surface and a backside surface forming emitter and base contact regions;
    a first electrically conductive interconnect layer having an interdigitated pattern of emitter electrodes and base electrodes on said backside surface of said crystalline substrate, said first electrically conductive interconnect layer having a thickness less than approximately 10 microns;
    electrically conductive emitter plugs and base plugs forming electrical connections to said emitter and base electrodes; and
    a backplane attached to said backside surface of said crystalline substrate by said electrically conductive plugs and providing permanent crystalline substrate reinforcement and high-conductivity solar cell interconnects, said backplane comprising:
        a second electrically conductive interconnect layer providing high-conductivity cell interconnects connected to said first electrically conductive interconnect layer by said electrically conductive emitter and base plugs, said second electrically conductive interconnect layer having an interdigitated pattern of emitter electrodes and base electrodes and a metallic layer thickness in the range of approximately 25 to 250 microns; and
        a backplane plate attached to said second electrically conductive interconnect layer.

2. The back contact solar cell of claim 1, further comprising a dielectric adhesive layer covering said first electrically conductive interconnect layer and exposing said electrically conductive emitter plugs and base plugs.

3. The back contact solar cell of claim 1, wherein said crystalline semiconductor substrate has a thickness less than 100 microns.

4. The back contact solar cell of claim 1, wherein said first electrically conductive interconnect layer has an interdigitated pattern with busbars and emitter electrodes and base electrodes.

5. The back contact solar cell of claim 1, wherein said second electrically conductive interconnect layer has an interdigitated pattern with busbars and emitter electrodes and base electrodes.

6. The back contact solar cell of claim 1, wherein said second electrically conductive interconnect layer has extended ends for forming wrap-around backside metal interconnects on said solar cell.

7. The back contact solar cell of claim 1, wherein said second electrically conductive interconnect layer aligns substantially parallel to said first electrically conductive interconnect layer.

8. The back contact solar cell of claim 1, wherein said second electrically conductive interconnect layer aligns substantially orthogonal to said first electrically conductive interconnect layer.

9. The back contact solar cell of claim 1, wherein said emitter electrodes and base electrodes of said second electrically conductive interconnect layer have deformed regions.

10. The back contact solar cell of claim 1, wherein said backside plate is an electrically insulating encapsulant layer.

11. The back contact solar cell of claim 1, wherein said second electrically conductive interconnect layer is aluminum foil.

12. A method for forming a back contact solar cell, comprising:
depositing a first layer of electrically conductive metal having an interdigitated pattern of base electrodes and emitter electrodes on a backside surface of a semiconductor substrate, said first layer of electrically conductive metal having a thickness approximately less than 10 microns;
forming electrically conductive emitter plugs and base plugs on said first layer of electrically conductive metal, said emitter plugs and base plugs providing electrically conductive emitter contacts and base contacts for connections to a backplane;
laminating said backplane to said first layer of electrically conductive metal and enabling backplane-to-cell electrical connections of said conductive emitter plugs and base plugs, said backplane comprising a second layer of electrically conductive metal having an interdigitated pattern of base electrodes and emitter electrodes and connected to said first layer of electrically conductive metal by said conductive emitter plugs and base plugs thereby, forming an electrical interconnect, said second layer of electrically conductive metal having a thickness in the range of approximately 25 to 250 microns, and a backplane plate attached to said second layer of electrically conductive metal.

13. The method of claim 12, further comprising the steps of
forming through holes exposing said emitter and base metal contacts on said backplane plate; and
at least partially filling said through holes with electrically conductive material for solar cell interconnections.

14. The method of claim 12, further comprising steps for forming said backplane:
forming said second layer of electrically conductive metal having a thickness in the range of 25 to 250 microns on a backplane plate; and
patterning said second layer of electrically conductive metal in an interdigitated pattern of base electrodes and emitter electrodes.

15. The method of claim 14, wherein said step of patterning said second layer of electrically conductive metal in an interdigitated pattern of base electrodes and emitter electrodes uses a metal foil slitting apparatus.

16. The method of claim 14, wherein said step of patterning said second layer of electrically conductive metal in an interdigitated pattern of base electrodes and emitter electrodes uses a metal ribbon laminating apparatus.

17. The method of claim 14, further comprising the step of forming locally and vertically deformed regions on said second layer of interdigitated pattern of base electrodes and emitter electrodes, said deformed regions aligned to electrically conductive emitter contacts and base contacts.

18. A method for forming a back contact solar cell, comprising:
forming a porous silicon seed and release layer with at least two different porosities on the surface of a crystalline silicon template;
depositing an epitaxial silicon layer on said porous silicon seed and release layer, said epitaxial silicon layer having a thickness less than 100 microns and an in-situ-doped base region, and said epitaxial silicon layer comprising doped emitter regions and a backside surface forming emitter and base contact regions with said in-situ-doped base regions and said doped emitter region;
depositing a first layer of electrically conductive metal having an interdigitated pattern of base electrodes and emitter electrodes on said backside surface of said epitaxial silicon layer, said first layer of electrically conductive metal having a thickness less than 2 microns;
forming electrically conductive adhesive emitter plugs and base plugs on said first layer of electrically conductive metal, said emitter plugs and base plugs providing emitter electrical connections and base electrical connections for a backplane;
laminating said backplane to said first layer of electrically conductive metal by said conductive adhesive emitter plugs and base plugs, said backplane comprising a second layer of electrically conductive metal having an interdigitated pattern of base electrodes and emitter electrodes and connected to said first layer of electrically conductive metal by said conductive adhesive emitter plugs and base plugs thereby forming an electrical interconnect, said second layer of electrically conductive metal having a thickness in the range of 25 to 150 microns, and a backplane plate attached to said second layer of electrically conductive metal; and
releasing said epitaxial silicon layer from said silicon template along said porous silicon release layer.

19. The method of claim 18, further comprising the steps of
forming through holes exposing said emitter and base metal electrodes of said second layer of electrically conductive material on said backplane plate; and
at least partially filling said through holes with electrically conductive material for solar cell interconnection.

20. The method of claim 18, further comprising forming a dielectric adhesive layer covering said first layer of electrically conductive metal and exposing said conductive adhesive emitter plugs and base plugs.

21. The method of claim 18, further comprising forming locally and vertically deformed regions on said second layer of base electrodes and emitter electrodes, said deformed regions aligned to electrically conductive emitter plugs and base plugs.

22. The back contact solar cell of claim 1, wherein said backplane plate has through holes providing electrically conductive connection to said emitter electrodes and base electrodes of said second electrically conductive interconnect layer.

23. The back contact crystalline semiconductor solar cell of claim 1, wherein said crystalline semiconductor substrate is a crystalline silicon substrate.

24. The back contact solar cell of claim 1, wherein said first electrically conductive interconnect layer comprises aluminum.

25. The back contact crystalline semiconductor solar cell of claim 1, wherein said wherein said second electrically conductive interconnect layer comprises copper.

26. The method for forming a back contact solar cell of claim 12, wherein said semiconductor substrate is a crystalline silicon substrate.

27. The method for forming a back contact solar cell of claim 12, wherein said second layer of electrically conductive metal is aluminum foil.

28. The method for forming a back contact solar cell of claim 12, wherein said second layer of electrically conductive metal comprises aluminum.

29. The method for forming a back contact solar cell of claim 12, wherein said second layer of electrically conductive metal comprises copper.

30. The method for forming a back contact solar cell of claim 18, wherein said second layer of electrically conductive metal is aluminum foil.

31. The method for forming a back contact solar cell of claim 18, wherein said second layer of electrically conductive metal comprises aluminum.

32. The method for forming a back contact solar cell of claim 18, wherein said second layer of electrically conductive metal comprises copper.

\* \* \* \* \*